(12) United States Patent
Ho et al.

(10) Patent No.: US 10,049,252 B2
(45) Date of Patent: Aug. 14, 2018

(54) CHIP PACKAGE AND FABRICATION METHOD THEREOF

(71) Applicant: XINTEC INC., Taoyuan (TW)

(72) Inventors: Yen-Shih Ho, Kaohsiung (TW); Shu-Ming Chang, New Taipei (TW); Tsang-Yu Liu, Zhubei (TW); Hsing-Lung Shen, Hsinchu (TW)

(73) Assignee: XINTEC INC., Taoyuan (TW)

( * ) Notice: Subject to any disclaimer, the term of this patent is extended or adjusted under 35 U.S.C. 154(b) by 209 days.

(21) Appl. No.: 14/967,153

(22) Filed: Dec. 11, 2015

(65) Prior Publication Data

US 2016/0171273 A1    Jun. 16, 2016

Related U.S. Application Data

(60) Provisional application No. 62/092,184, filed on Dec. 15, 2014.

(51) Int. Cl.
*G06K 9/00* (2006.01)
*H01L 21/48* (2006.01)
(Continued)

(52) U.S. Cl.
CPC ....... *G06K 9/0002* (2013.01); *G06K 9/00013* (2013.01); *G06F 3/0414* (2013.01); *H01L 2224/16225* (2013.01)

(58) Field of Classification Search
CPC .. G06K 9/00; G06K 9/00006; G06K 9/00013; G06K 9/0002; H01L 2224/16225; G01D 5/24; G01D 5/241; G01D 5/2412; G01D 5/2417; G01R 27/00; G01R 27/02; G01R 27/26; G01R 27/2605; G06F 3/0414; G06F 2203/04103; G01L 1/146; H03K 17/955; H03K 2217/960725
USPC ....... 324/500, 519, 548, 600, 649, 658, 661, 324/662, 663, 669, 671, 684, 686, 750.17; 702/47, 52; 345/173, 174
See application file for complete search history.

(56) References Cited

U.S. PATENT DOCUMENTS

| | | | |
|---|---|---|---|
| 5,672,911 A * | 9/1997 | Patil ..................... | H01L 23/642 257/691 |
| 7,538,760 B2 * | 5/2009 | Hotelling .............. | G06F 3/0414 178/18.06 |

(Continued)

FOREIGN PATENT DOCUMENTS

| TW | 201113992 | 4/2011 |
|---|---|---|
| TW | 201128755 | 8/2011 |

(Continued)

*Primary Examiner* — Hoai-An D Nguyen
(74) *Attorney, Agent, or Firm* — Liu & Liu

(57) ABSTRACT

A chip package includes a substrate, a capacitive sensing layer and a computing chip. The substrate has a first surface and a second surface opposite to the first surface, and the capacitive sensing layer is disposed above the second surface and having a third surface opposite to the second surface, which the capacitive sensing layer includes a plurality of capacitive sensing electrodes and a plurality of metal wires. The capacitive sensing electrodes are on the second surface, and the metal wires are on the capacitive sensing electrodes. The computing chip is disposed above the third surface and electrically connected to the capacitive sensing electrodes.

20 Claims, 28 Drawing Sheets

(51) Int. Cl.
*H01L 23/498* (2006.01)
*G06F 3/041* (2006.01)

(56) References Cited

U.S. PATENT DOCUMENTS

| | | | |
|---|---|---|---|
| 9,507,196 B2 * | 11/2016 | Kurasawa | G02F 1/13338 |
| 9,740,908 B2 * | 8/2017 | Wang | G06K 9/00013 |
| 2011/0248961 A1 | 10/2011 | Svajda et al. | |
| 2015/0130742 A1 * | 5/2015 | Chen | G06F 3/044 |
| | | | 345/174 |

FOREIGN PATENT DOCUMENTS

| | | |
|---|---|---|
| TW | 201140779 | 11/2011 |
| TW | 201310612 | 3/2013 |
| TW | 201413905 | 4/2014 |
| TW | M477621 | 5/2014 |
| TW | 201431023 | 8/2014 |
| TW | 201440187 | 10/2014 |
| TW | 201442175 | 11/2014 |

* cited by examiner

CHIP PACKAGE AND FABRICATION METHOD THEREOF

RELATED APPLICATIONS

This application claims priority to U.S. provisional Application Ser. No. 62/092,184, filed Dec. 15, 2014, which is herein incorporated by reference.

BACKGROUND

Field of Invention

The present invention relates to a chip package and fabrication method thereof.

Description of Related Art

Along with the trends of electronic devices toward lighter and more compact, the semiconductor chip corresponding to the electronic device has a reduced size and increased wiring density. Therefore, it is more difficult and challenging to fabricate a semiconductor chip package in the subsequent process for the semiconductor chip. Wafer-level chip package is a method of packaging the semiconductor chip, which the method means that all chips are packaged and tested after completion of manufacturing these chips on the wafer, and then the wafer is diced into single chip package.

Traditional finger print sensor device includes a fingerprint sensing chip and capacitive sensing electrodes packaged in the same layer. However, this process of fabricating the abovementioned finger print sensor device involves multi-step patterning process and deposition process, which not only increases the cost of production, but also prolongs the process time. Therefore, a chip packaging technology is necessary in the industry to simplify and accelerate the process.

SUMMARY

The present disclosure provides a chip package including a substrate, a capacitive sensing layer and a computing chip. The substrate has a first surface and a second surface opposite to the first surface, and the capacitive sensing layer is disposed above the second surface and having a third surface opposite to the second surface, which the capacitive sensing layer includes a plurality of capacitive sensing electrodes and a plurality of metal wires. The capacitive sensing electrodes are on the second surface, and the metal wires are on the capacitive sensing electrodes. The computing chip is disposed above the third surface and electrically connected to the capacitive sensing electrodes.

The present disclosure provides a chip package including a substrate, a capacitive sensing layer and a computing chip. The substrate has a first surface and a second surface opposite to the first surface, and the capacitive sensing layer is disposed below the first surface and having a third surface opposite to the second surface, which the capacitive sensing layer includes a plurality of capacitive sensing electrodes and a plurality of metal wires. The capacitive sensing electrodes are on the third surface, and the metal wires are on the capacitive sensing electrodes. The computing chip is disposed above the capacitive sensing layer and electrically connected to the capacitive sensing electrodes.

The present disclosure provides a method of fabricating a chip package, and the method includes following steps. A substrate having a first surface and a second surface opposite to the first surface is received, and a capacitive sensing layer is formed above the second surface, which the capacitive sensing layer having a third surface opposite to the second surface. The capacitive sensing layer is formed by forming a plurality of capacitive sensing electrodes on the second surface, and a plurality of metal wires are formed on the capacitive sensing electrodes. A computing chip is formed above the third surface to electrically connect the capacitive sensing electrodes and the computing chip.

The present disclosure provides a method of fabricating a chip package, and the method includes following steps. A substrate having a first surface and a second surface opposite to the first surface is received, and a capacitive sensing layer is formed below the first surface, which the capacitive sensing layer having a third surface opposite to the first surface. The capacitive sensing layer is formed by forming a plurality of metal wires below the first surface, and a plurality of capacitive sensing electrodes are formed below the metal wires. A computing chip is formed above the capacitive sensing layer to electrically connect the capacitive sensing electrodes and the computing chip.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
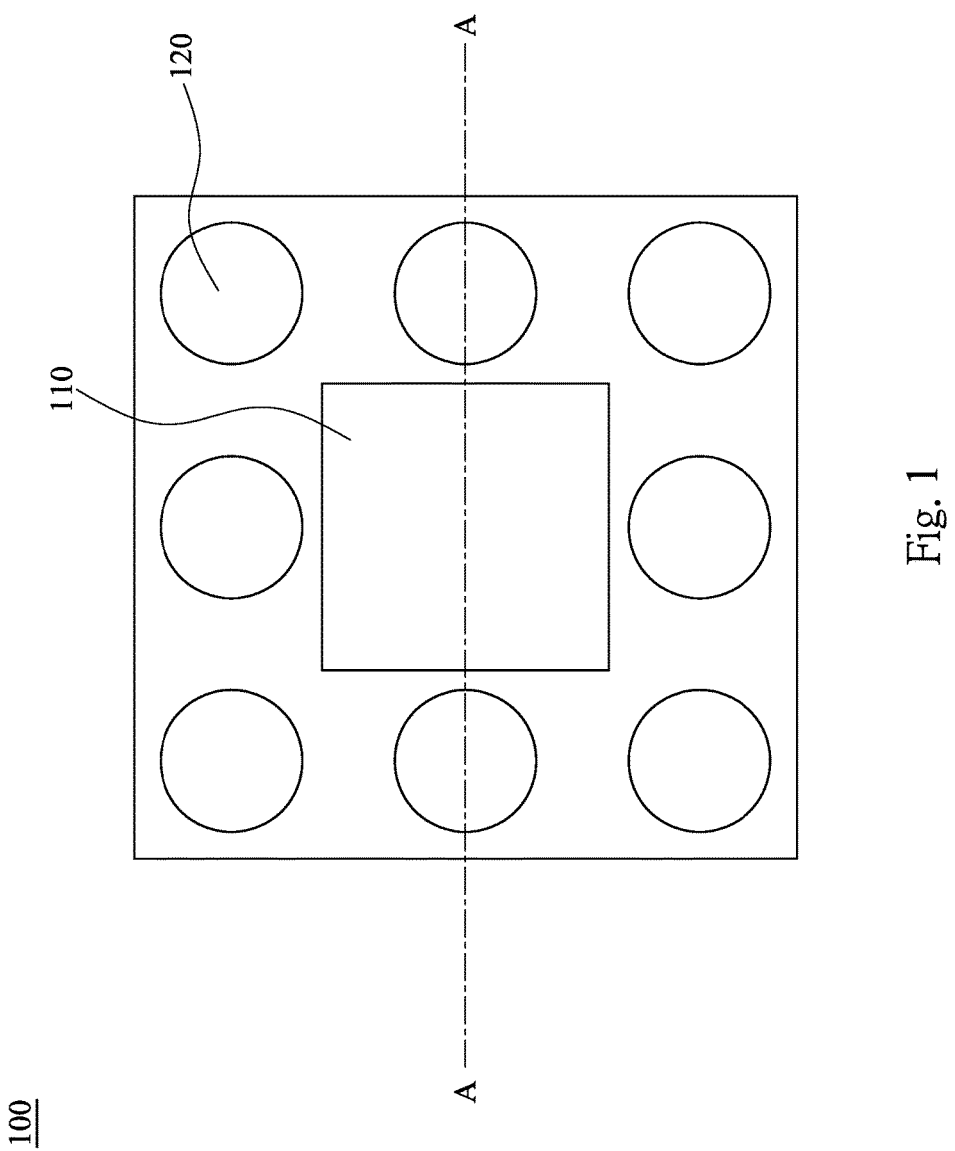
FIG. 1 illustrates a top view of a chip package according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a top view of a chip package 100 according to various embodiments of the present disclosure. As shown in FIG. 1, the chip package 100 includes a computing chip 110 and a plurality of first external conductive connections 120 surrounding the computing chip 110. In some embodiments, the computing chip 110 is a fingerprint sensing chip, which is able to read different capacitive values generated by peaks and troughs of a fingerprint, so as to perform a fingerprint algorithm operation.

Figure 2:
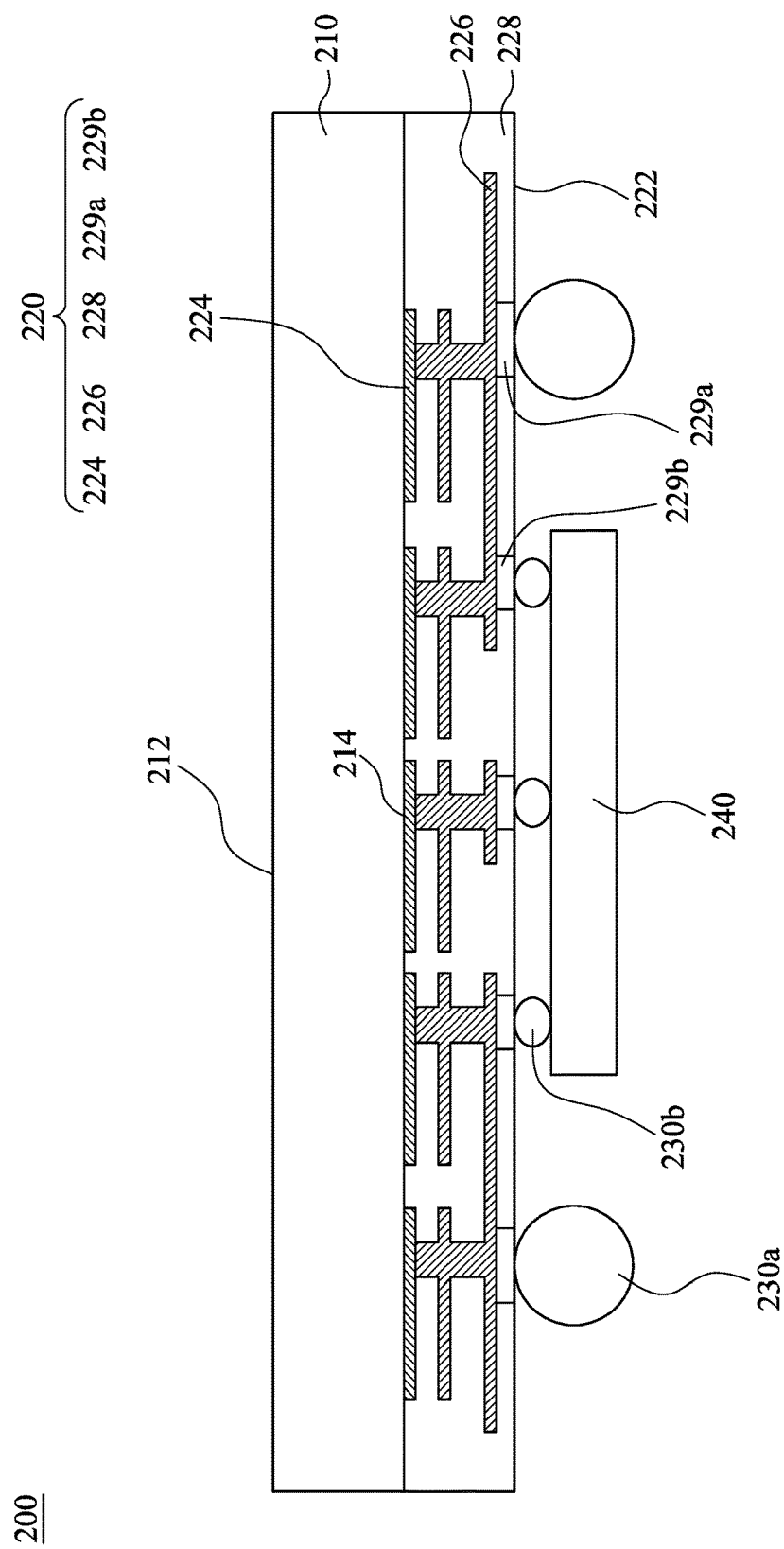
FIG. 2 illustrates a cross-sectional view of the chip package in FIG. 1 along the line A-A, in accordance with some embodiments of the present disclosure.

Continuing in FIG. 2, FIG. 2 illustrates a cross-sectional view of the chip package in FIG. 1 along the line A-A, in accordance with some embodiments. As shown in FIG. 2, a chip package 200 includes a substrate 210, a capacitive sensing layer 220, a plurality of first external conductive connections 230a and second external conductive connections 230b, and a computing chip 240. The substrate 210 has a first surface 212 and a second surface 214 opposite to the first surface 212, which the first surface 212 acts as a fingerprint sensing surface. In some embodiments, the substrate 210 includes high-k dielectric materials, such as glass, sapphire, aluminum nitride or combinations thereof, but not limited thereto. Other suitable high-k dielectric materials are also applicable to fabricate the substrate 210.

The capacitive sensing layer 220 is disposed above the second surface 214 of the substrate 210, and the capacitive sensing layer 220 has a third surface 222 opposite to the second surface 214. The capacitive sensing layer 220 includes a plurality of capacitive sensing electrodes 224 and a plurality of metal wires 226 disposed on and electrically connected to the capacitive sensing electrodes 224. In addition, the capacitive sensing layer 220 further includes an insulating material 228, so as to avoid improper electrical connection between the capacitive sensing electrodes 224 and the metal wires 226. In some embodiments, the insulating material 228 includes silicon oxide, silicon nitride, silicon oxynitride or other suitable insulating materials. In various embodiments, the capacitive sensing electrodes 224 and the metal wires 226 include aluminum, copper, nickel, or other suitable conductive materials.

These capacitive sensing electrodes 224 are above the second surface 214 of the substrate 210, which the capacitive sensing electrodes 224 act as a bottom electrode of a metal-insulator-metal (MIM) capacitor. Specifically, user's finger acts as a top electrode of the MIM capacitor when touching the first surface 212 of the substrate. As such, different capacitive values are respectively generated between the capacitive sensing electrodes 224 in respect to the troughs and the peaks of the fingerprint, since distances between the troughs and the capacitive sensing electrodes 224 are different from distances between the peaks and the capacitive sensing electrodes 224. Even through the capacitive sensing electrodes 224 illustrated in FIG. 2 are in contact with the second surface 214 of the substrate 210, but not limited thereto. In some embodiments, the capacitive sensing electrodes 224 are not in contact with the second surface 214 of the substrate 210, and a portion of the insulating material 228 is interposed between the capacitive sensing electrodes 224 and the second surface 214.

The first external conductive connections 230a and the second external conductive connections 230b are disposed above the metal wires 226, which are in the capacitive sensing layer 220. The first external conductive connections 230a are larger than second external conductive connections 230b in size, and the first external conductive connections 230a surround the second external conductive connections 230b. In some embodiments, the first external conductive connections 230a and the second external conductive connections 230b are in contact with the metal wires 226.

In some embodiments, the capacitive sensing layer further includes a plurality of first conductive pads 229a and a plurality of second conductive pads 229b, which the first conductive pads 229a are disposed between the metal wires 226 and the first external conductive connections 230a, and the second conductive pads 229b are disposed between the metal wires 226 and the second external conductive connections 230b.

In some embodiments, the first external conductive connections 230a and the second external conductive connections 230b include solder balls, bumps or other well-known structures in the industry and having a shape of spherical, oval, square or rectangular, but not limited thereto. In various embodiments, the first conductive pads 229a and the second conductive pads 229b are under bump metallization, which includes nickel or gold.

The computing chip 240 is disposed above the third surface 222 of the capacitive sensing layer 220. Specifically, the computing chip 240 is disposed above and in contact with the second external conductive connections 230b. Therefore, the computing chip 240 is electrically connected to the capacitive sensing electrodes 224 via the second external conductive connections 230b, second conductive pad 229b and the metal wires 226. As such, the computing chip 240 is able to receive/read the different capacitive values between the capacitive sensing electrodes 224 and the finger, so as to compute these capacitive values by a fingerprint identification operation. In addition, the first external conductive connections 230a are electrically connected to the computing chip 240 via the second external conductive connections 230b, the second conductive pad 229b, the metal wires 226 and first conductive pad 229a, and thus a computing result generated by the computing chip 240 is transferred to the first external conductive connections 230a, which transfers the computing result to other devices. For example, the chip package 200 is mounted on a printed circuit board in the subsequent process, and the first external conductive connections 230a transfer the computing result to a processor on the printed circuit board to determine whether the read fingerprint pattern is consistent with the initial setting of the user.

Figure 3:
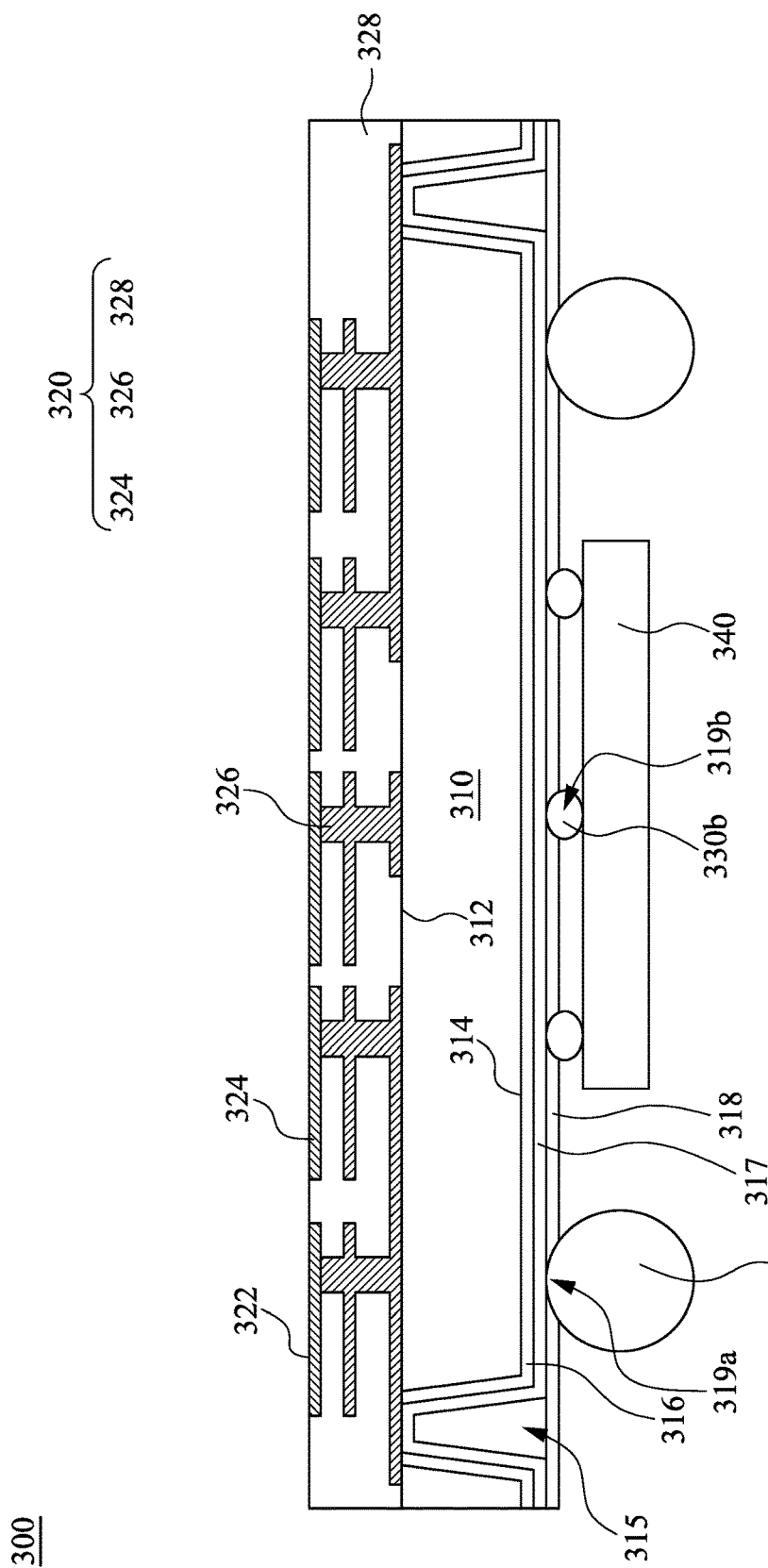
FIG. 3 illustrates a cross-sectional view of the chip package, in accordance with various embodiments of the present disclosure.

Continuing in FIG. 3, FIG. 3 illustrates a cross-sectional view of the chip package, in accordance with some embodiments of the present disclosure. It should be noticed that the materials of the same elements are not described herein.

As shown in FIG. 3, a chip package 300 includes a substrate 310, a capacitive sensing layer 320, a plurality of first external conductive connections 330a and second external conductive connections 330b, and a computing chip 340. The substrate 310 has a first surface 312 and a second surface 314 opposite to the first surface 312. In some embodiments, the substrate 310 is a blank silicon wafer or other semiconductor substrates without any circuits.

The capacitive sensing layer 320 is disposed below the first surface 312 of the substrate 310, and the capacitive sensing layer 320 has a third surface 322 opposite to the first surface 312, which the third surface 322 acts as a fingerprint sensing surface. The capacitive sensing layer 320 includes a plurality of capacitive sensing electrodes 324 and a plurality of metal wires 326 disposed on and electrically connected to the capacitive sensing electrodes 324. In addition, the capacitive sensing layer 320 further includes an insulating material 328, so as to avoid improper electrical connection between the capacitive sensing electrodes 324 and the metal wires 326.

These capacitive sensing electrodes 324 are above the third surface 322 of the capacitive sensing layer 320, which the capacitive sensing electrodes 324 act as a bottom electrode of a metal-insulator-metal (MIM) capacitor. Specifically, user's finger acts as a top electrode of the MIM capacitor when touching the third surface 322 of the capacitive sensing layer 320. As such, different capacitive values are respectively generated between the capacitive sensing electrodes 324 in respect to the troughs and the peaks of the fingerprint, since distances between the troughs and the capacitive sensing electrodes 324 are different from distances between the peaks and the capacitive sensing electrodes 324. Even through the capacitive sensing electrodes 324 illustrated in FIG. 3 are in contact with the third surface 322 of the capacitive sensing layer 320, but not limited thereto. In some embodiments, the capacitive sensing electrodes 324 are not in contact with the third surface 322 of the capacitive sensing layer 320, and a portion of the insulating material 328 is interposed between the capacitive sensing electrodes 324 and the third surface 322.

In some embodiments, the chip package 300 further includes a high-k material layer disposed below the third surface 322 of the capacitive sensing layer 320, and the high-k material layer has a fourth surface opposite to the third surface. In this case, the fourth surface of the high-k material layer acts as the fingerprint sensing surface.

The substrate 310 further includes a through hole 315 extending from the second surface 314 to the first surface 312 of the substrate 310, so as to expose the metal wires 326. An isolation layer 316 is disposed above the second surface 314 and extended into the through hole 315 to cover sidewalls of the through hole 315, and a redistribution layer 317 is disposed above the isolation layer 316 and extended into the through hole 315 to contact the metal wires 326, which is exposed from the through hole 315. A passivation layer 318 is disposed above the redistribution layer 317, and the passivation layer 318 has a plurality of first openings 319a and second openings 319b exposing the redistribution layer 317. The first openings 319a surround the second openings 319b.

In some embodiments, the isolation layer 316 includes silicon oxide, silicon nitride, silicon oxynitride or other suitable insulating materials; the redistribution layer 317 includes aluminum, copper, nickel or other suitable conductive materials; and the passivation layer 318 includes epoxy materials.

The first external conductive connections 330a are disposed above the second surface 314 of the substrate 310 and respectively in the first openings 319a to contact the redistribution layer 317, and the second external conductive connections 330b are also disposed above the second surface 314 of the substrate 310 and respectively in the second openings 319b to contact the redistribution layer 317. The first external conductive connections 330a are larger than second external conductive connections 330b in size, and the first external conductive connections 330a surround the second external conductive connections 330b.

The computing chip 340 is disposed above the capacitive sensing layer 320. In this embodiment, the computing chip 340 is disposed above the second surface 314 of the substrate 310, specifically, the computing chip 340 is disposed above and in contact with the second external conductive connections 330b. Therefore, the computing chip 340 is electrically connected to the capacitive sensing electrodes 324 via the second external conductive connections 330b, the redistribution layer 317 and the metal wires 326. As such, the computing chip 340 is able to receive/read the different capacitive values between the capacitive sensing electrodes 324 and the finger, so as to compute these capacitive values by a fingerprint identification operation. In addition, the first external conductive connections 330a are electrically connected to the computing chip 340 via the second external conductive connections 330b and the redistribution layer 317, and thus a computing result generated by the computing chip 340 is transferred to the first external conductive connections 330a, which transfers the computing result to other devices.

Figure 4:
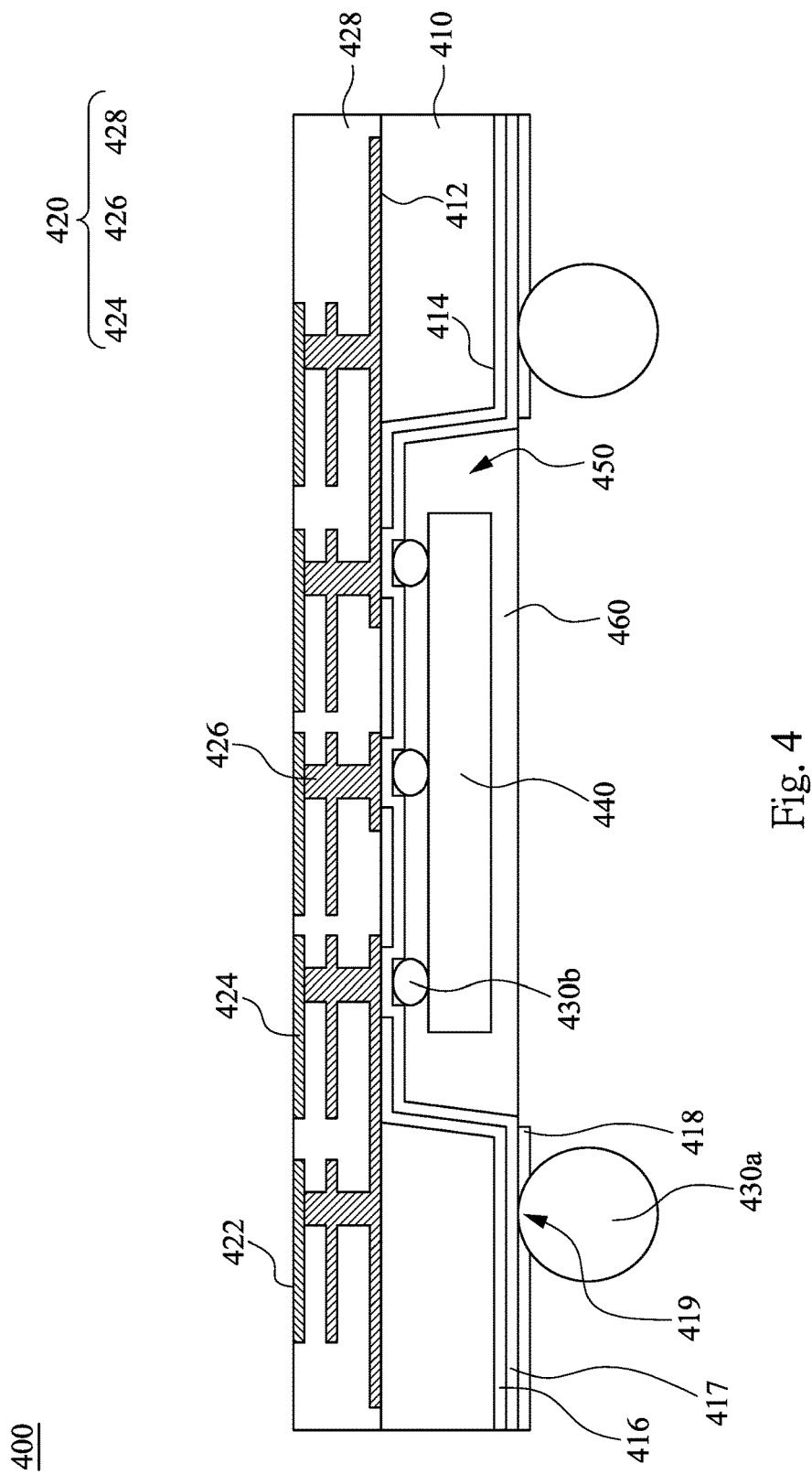
FIG. 4 illustrates a cross-sectional view of the chip package, in accordance with various embodiments of the present disclosure.

Continuing in FIG. 4, FIG. 4 illustrates a cross-sectional view of the chip package, in accordance with various embodiments of the present disclosure. As shown in FIG. 4, a chip package 400 includes a substrate 410, a capacitive sensing layer 420, a plurality of first external conductive connections 430a and second external conductive connections 430b, and a computing chip 440. The substrate 410 has a first surface 412 and a second surface 414 opposite to the first surface 412.

The capacitive sensing layer 420 is disposed below the first surface 412 of the substrate 410, and the capacitive sensing layer 420 has a third surface 422 opposite to the first surface 412, which the third surface 422 acts as a fingerprint sensing surface. The capacitive sensing layer 420 includes a plurality of capacitive sensing electrodes 424 and a plurality of metal wires 426 disposed on and electrically connected to the capacitive sensing electrodes 424. In addition, the capacitive sensing layer 420 further includes an insulating material 428, so as to avoid improper electrical connection between the capacitive sensing electrodes 424 and the metal wires 426.

These capacitive sensing electrodes 424 are above the third surface 422 of the capacitive sensing layer 420, which the capacitive sensing electrodes 424 act as a bottom electrode of a metal-insulator-metal (MIM) capacitor. Specifically, user's finger acts as a top electrode of the MIM capacitor when touching the third surface 422 of the capacitive sensing layer 420. As such, different capacitive values are respectively generated between the capacitive sensing electrodes 424 in respect to the troughs and the peaks of the fingerprint, since distances between the troughs and the capacitive sensing electrodes 424 are different from distances between the peaks and the capacitive sensing electrodes 424. Even through the capacitive sensing electrodes 424 illustrated in FIG. 4 are in contact with the third surface 422 of the capacitive sensing layer 420, but not limited thereto. In some embodiments, the capacitive sensing electrodes 424 are not in contact with the third surface 422 of the capacitive sensing layer 420, and a portion of the insulating material 428 is interposed between the capacitive sensing electrodes 424 and the third surface 422.

In some embodiments, the chip package 400 further includes a high-k material layer disposed below the third surface 422 of the capacitive sensing layer 420, and the high-k material layer has a fourth surface opposite to the third surface 422. In this case, the fourth surface of the high-k material layer acts as the fingerprint sensing surface.

The substrate 410 further includes a recess 450 extending from the second surface 414 to the first surface 412 of the substrate 410, so as to expose the metal wires 426. The differences between the chip package 400 in FIG. 4 and the chip package 300 in FIG. 3 are described below. The through holes 315 shown in FIG. 3 are located on both sides of the substrate 310. Relatively, the recess 450 shown in FIG. 4 is located at a center of the substrate 410. In addition, a hole diameter of the recess 450 is larger than a hole diameter of the through holes 315. Specifically, the hole diameter of the recess 450 is greater than a width and a length of the computing chip 420.

An isolation layer 416 is disposed above the second surface 414 and extended into the recess 450 to cover sidewalls and a portion of a bottom of the recess 450, and a redistribution layer 417 is disposed above the isolation layer 416 and extended into the recess 450 to contact the metal wires 426, which is exposed from the recess 450. A passivation layer 418 is disposed above the redistribution layer 417, and the passivation layer 418 has a plurality of first openings 419 exposing the redistribution layer 417 above the second surface 414.

The first external conductive connections 430a are disposed above the second surface 414 of the substrate 410 and respectively in the first openings 419 to contact the redistribution layer 417. The another difference between FIG. 3 and FIG. 4 is that the second external conductive connections 430b in FIG. 4 are in the recess 450 of the substrate 410, so as to contact the redistribution layer 417 exposed from the recess 450. The first external conductive connections 430a are larger than second external conductive connections 430b in size, and the first external conductive connections 430a surround the second external conductive connections 430b.

The computing chip 440 is disposed above the capacitive sensing layer 420. In this embodiment, the computing chip 440 is disposed in the recess 450 of the substrate 410. Specifically, the computing chip 440 is disposed between the first surface 412 and the second surface 414 of the substrate 410. Also, the computing chip 440 is disposed above and in contact with the second external conductive connections 430b. Therefore, the computing chip 440 is electrically connected to the capacitive sensing electrodes 424 via the second external conductive connections 430b, the redistribution layer 417 and the metal wires 426. As such, the computing chip 440 is able to receive/read the different capacitive values between the capacitive sensing electrodes 424 and the finger, so as to compute these capacitive values by a fingerprint identification operation. In addition, the first external conductive connections 430a are electrically connected to the computing chip 440 via the second external conductive connections 430b and the redistribution layer 417, and thus a computing result generated by the computing chip 440 is transferred to the first external conductive connections 430a, which transfers the computing result to other devices. In addition, the chip package 400 further includes a protecting layer 460 fully filling the recess 450 to cover the computing chip 440 and the second external conductive connections 430b, which the protecting layer 460 includes epoxy materials.

Figure 5:
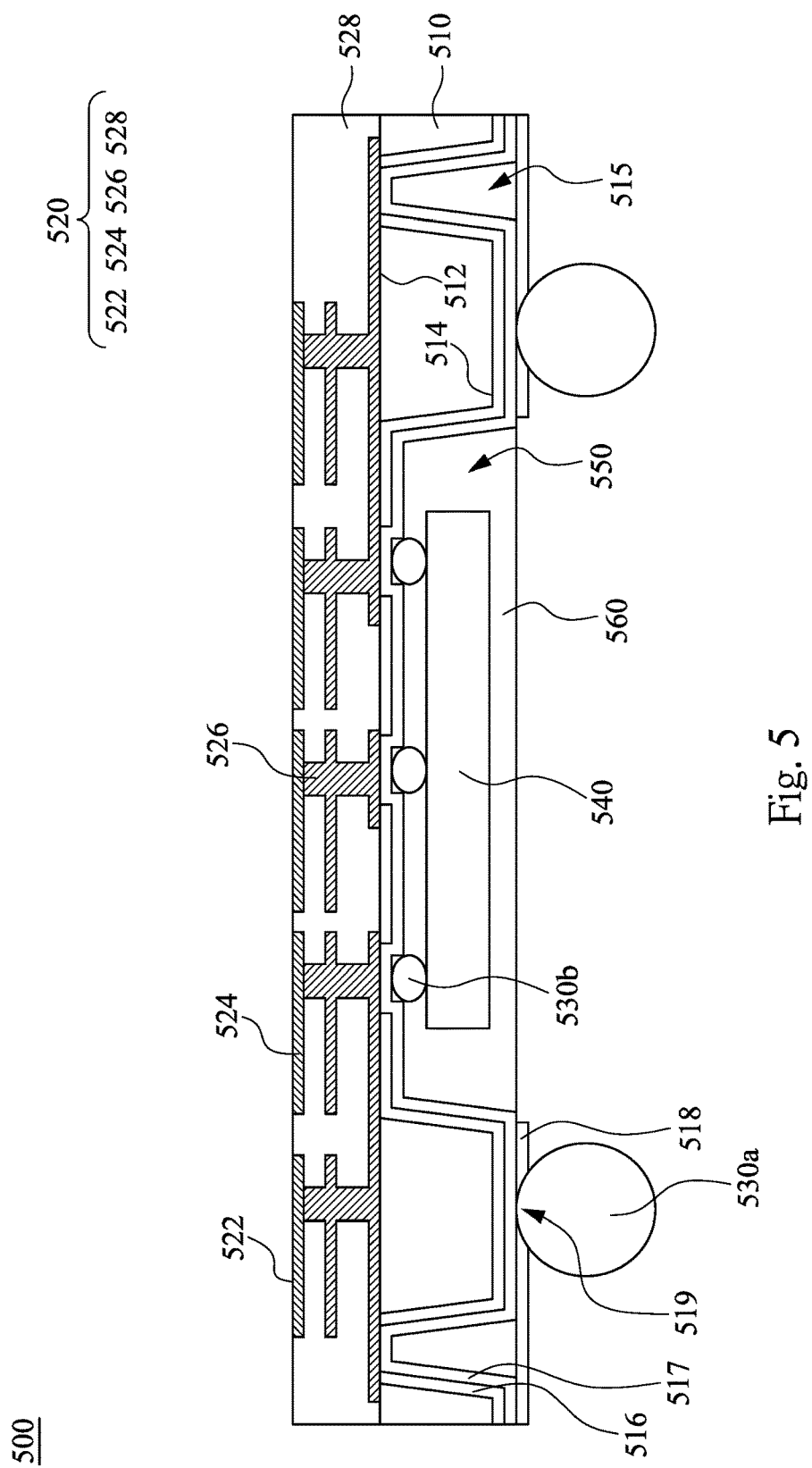
FIG. 5 illustrates a cross-sectional view of the chip package, in accordance with various embodiments of the present disclosure.

Continuing in FIG. 5, FIG. 5 illustrates a cross-sectional view of the chip package, in accordance with various embodiments of the present disclosure. As shown in FIG. 5, a chip package 500 includes a substrate 510, a capacitive sensing layer 520, a plurality of first external conductive connections 530a and second external conductive connections 530b, and a computing chip 540. The substrate 510 has a first surface 512 and a second surface 514 opposite to the first surface 512.

The capacitive sensing layer 520 is disposed below the first surface 512 of the substrate 510, and the capacitive sensing layer 520 has a third surface 522 opposite to the first surface 512, which the third surface 522 acts as a fingerprint sensing surface. The capacitive sensing layer 520 includes a plurality of capacitive sensing electrodes 524 and a plurality of metal wires 526 disposed on and electrically connected to the capacitive sensing electrodes 524. In addition, the capacitive sensing layer 520 further includes an insulating material 528, so as to avoid improper electrical connection between the capacitive sensing electrodes 524 and the metal wires 526.

These capacitive sensing electrodes 524 are above the third surface 522 of the capacitive sensing layer 520, which the capacitive sensing electrodes 524 act as a bottom electrode of a metal-insulator-metal (MIM) capacitor. Specifically, user's finger acts as a top electrode of the MIM capacitor when touching the third surface 522 of the capacitive sensing layer 520. As such, different capacitive values are respectively generated between the capacitive sensing electrodes 524 in respect to the troughs and the peaks of the fingerprint, since distances between the troughs and the capacitive sensing electrodes 524 are different from distances between the peaks and the capacitive sensing electrodes 524. Even through the capacitive sensing electrodes 524 illustrated in FIG. 5 are in contact with the third surface 522 of the capacitive sensing layer 520, but not limited thereto. In some embodiments, the capacitive sensing electrodes 524 are not in contact with the third surface 522 of the capacitive sensing layer 520, and a portion of the insulating material 528 is interposed between the capacitive sensing electrodes 524 and the third surface 522.

In some embodiments, the chip package 500 further includes a high-k material layer disposed below the third surface 522 of the capacitive sensing layer 520, and the high-k material layer has a fourth surface opposite to the third surface 522. In this case, the fourth surface of the high-k material layer acts as the fingerprint sensing surface.

The substrate 510 further includes a recess 550 and a through hole 515 extending from the second surface 514 to the first surface 512 of the substrate 510, so as to expose the metal wires 526. The differences between the chip package 500 in FIG. 5 and the chip package 400 in FIG. 4 are described below. The substrate 410 in FIG. 4 only has the recess 450 at the center of the substrate 410. Relatively, the substrate 510 in FIG. 5 not only has the recess 550 at the center of the substrate 510, but also has the through holes 515 on both sides of the substrate 510, and the through holes 515 surround the recess 550. In addition, a hole diameter of the recess 550 is greater than a width and a length of the computing chip 540.

An isolation layer 516 is disposed above the second surface 514 and extended into the recess 550 to cover sidewalls and a portion of a bottom of the recess 550. The isolation layer 516 is also extended into the through hole 515 to cover sidewalls of the through hole 515. A redistribution layer 517 is disposed above the isolation layer 516 and extended into the recess 550 to contact the metal wires 526, which is exposed from the recess 550. The redistribution layer 517 is further extended into the through hole 515 to contact the metal wires 526 exposed from the through hole 515. A passivation layer 518 is disposed above the redistribution layer 517, and the passivation layer 518 has a plurality of first openings 519 exposing the redistribution layer 517 above the second surface 514.

The first external conductive connections 530a are disposed above the second surface 514 of the substrate 510 and respectively in the first openings 519 to contact the redistribution layer 517. The second external conductive connections 530b are in the recess 550 of the substrate 510 and in contact with the redistribution layer 517 exposed from the recess 550. The first external conductive connections 530a are greater than second external conductive connections 530b in size, and the first external conductive connections 530a surround the second external conductive connections 530b.

The computing chip 540 is disposed above the capacitive sensing layer 520. In this embodiment, the computing chip 540 is disposed in the recess 550 of the substrate 510. Specifically, the computing chip 540 is disposed between the first surface 512 and the second surface 514 of the substrate 510. Also, the computing chip 540 is disposed above and in contact with the second external conductive connections 530b. Therefore, the computing chip 540 is electrically connected to the capacitive sensing electrodes 524 via the second external conductive connections 530b, the redistribution layer 517 and the metal wires 526. As such, the computing chip 540 is able to receive/read the different capacitive values between the capacitive sensing electrodes 524 and the finger, so as to compute these capacitive values by a fingerprint identification operation. In addition, the first external conductive connections 530a are electrically connected to the computing chip 540 via the second external conductive connections 530b and the redistribution layer 517, and thus a computing result generated by the computing chip 540 is transferred to the first external conductive connections 530a, which transfers the computing result to other devices. In addition, the chip package 500 further includes a protecting layer 560 fully filling the recess 550 to cover the computing chip 540 and the second external conductive connections 530b, which the protecting layer 560 includes epoxy materials.

Referring now to FIGS. 6A to 6G to further understand a method of fabricating the chip package, which FIGS. 6A to 6G are cross-sectional views of the chip package in FIG. 2 at intermediate stages of fabrication, in accordance with various embodiments.

Figure 6A:
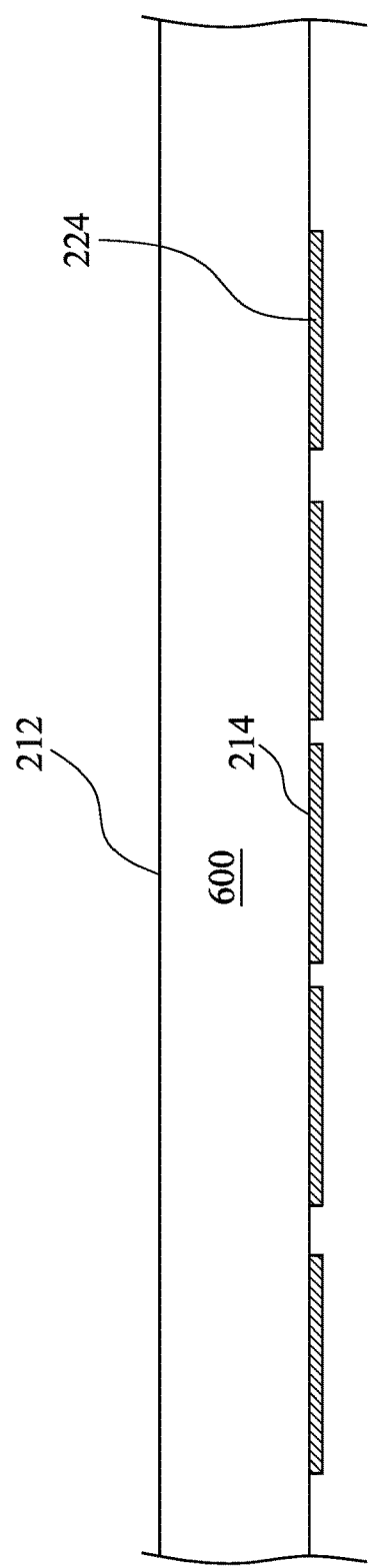
FIGS. 6A to 6G are cross-sectional views of the chip package in FIG. 2 at intermediate stages of fabrication, in accordance with various embodiments.

In FIG. 6A, a substrate 600 having a first surface 212 and a second surface 214 is received, and the first surface 212 is opposite to the second surface 214. It is worthy noting that the substrate 600 is diced to form a plurality of substrates 210 shown in FIG. 2. Then, a capacitive sensing layer 220 is formed above the second surface 214 of the substrate 600 by multiple steps. First, a plurality of capacitive sensing electrodes 224 are formed in FIG. 6A. A conductive material is sputtered, evaporated, electroplated or electroless-plated on the second surface 214, and the conductive material is patterned by a photolithography etching method to form these capacitive sensing electrodes 224. The photolithography etching method includes following steps. A photoresist layer is formed on the conductive material, and a mask is applied to pattern the photoresist layer. The conductive material not protected by the patterned photoresist layer is etched, so as to form the capacitive sensing electrodes 224. Then, the patterned photoresist layer is removed.

Figure 6B:
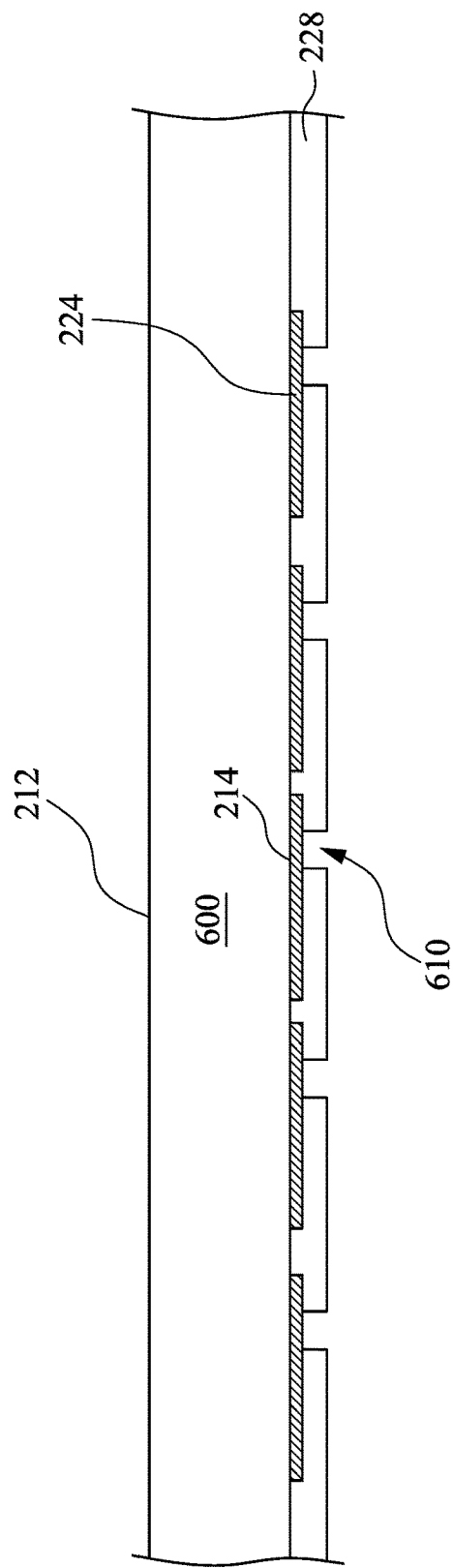

Continuing in FIG. 6B, an insulating material 228 is formed to cover the capacitive sensing electrodes 224. The insulating material 228 may be formed by suitable deposition processes, and the insulating material 228 is further photolithography etched to form holes 610 respectively exposing the capacitive sensing electrodes 224. In the subsequent process, metal wires 226 are respectively formed in the holes 610, so as to be electrically connected to the capacitive sensing electrodes 224. The photolithography etching method includes following steps. A photoresist layer is formed to cover the insulating material 228, and a mask is applied to pattern the photoresist layer. The insulating material 228 not protected by the patterned photoresist layer is etched to form holes 610 exposing the capacitive sensing electrodes 224. Then, the patterned photoresist layer is removed. In some embodiments, the insulating material 228 is selected form a photosensitive polymer, which is directly exposed and etched to form the pattern, and thus omitting the use of the photoresist layer.

Figure 6C:
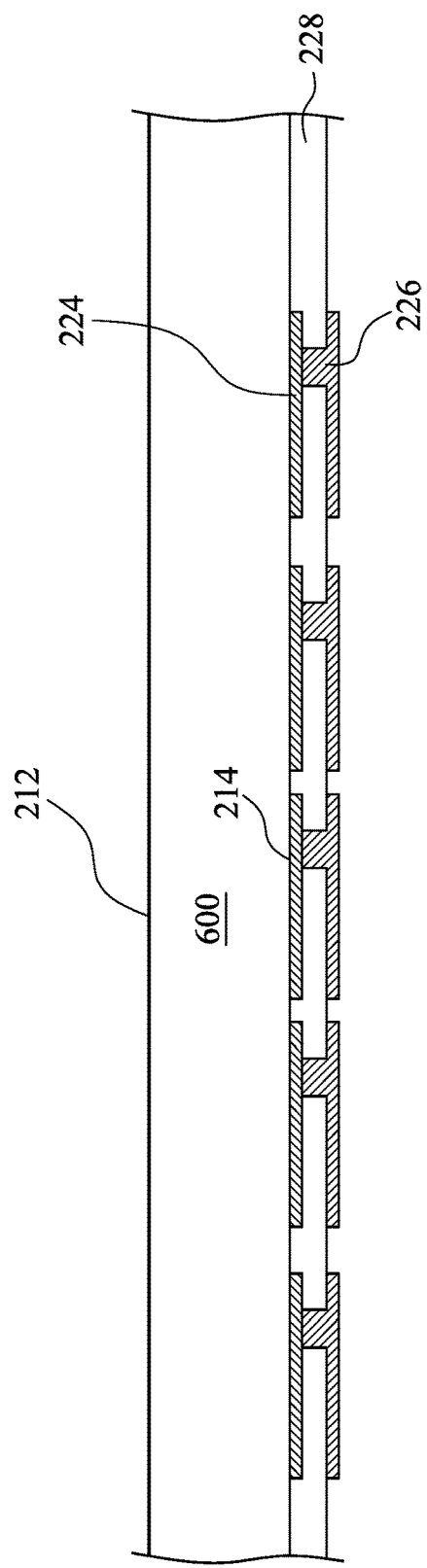

Continuing in FIG. 6C, a plurality of metal wires 226 are formed on the capacitive sensing electrodes 224. These metal wires 226 may be formed by following steps. The conductive material is sputtered, evaporated, electroplated or electroless-plated on the insulating material 228, and a photolithography etching process is performed to pattern the conductive material, so as to form the metal wires 226. It should be noticed that, a portion of the metal wire 226 is in the hole 610 to electrically connect the capacitive sensing electrode 224.

Figure 6D:
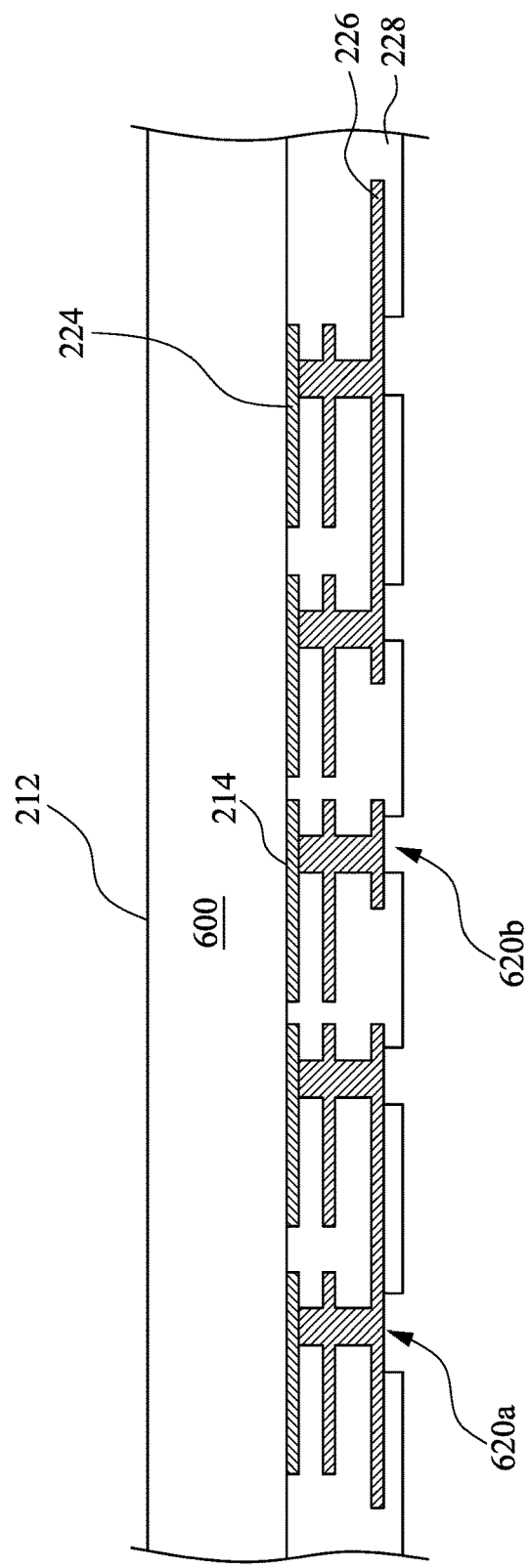

Continuing in FIG. 6D, the steps in FIG. 6B and FIG. 6C are repeated to form multi-layer metal wires 226 and insulating material 228, and these repeated steps are not described herein. Then, a plurality of first openings 620a and second openings 620b are formed to expose the metal wires 226. In this step, the photolithography etching process mentioned above is performed to remove a portion of the insulating material 228, so as to form the first openings 620a and the second openings 620b, which the first openings 620a surrounds the second openings 620b.

Figure 6E:
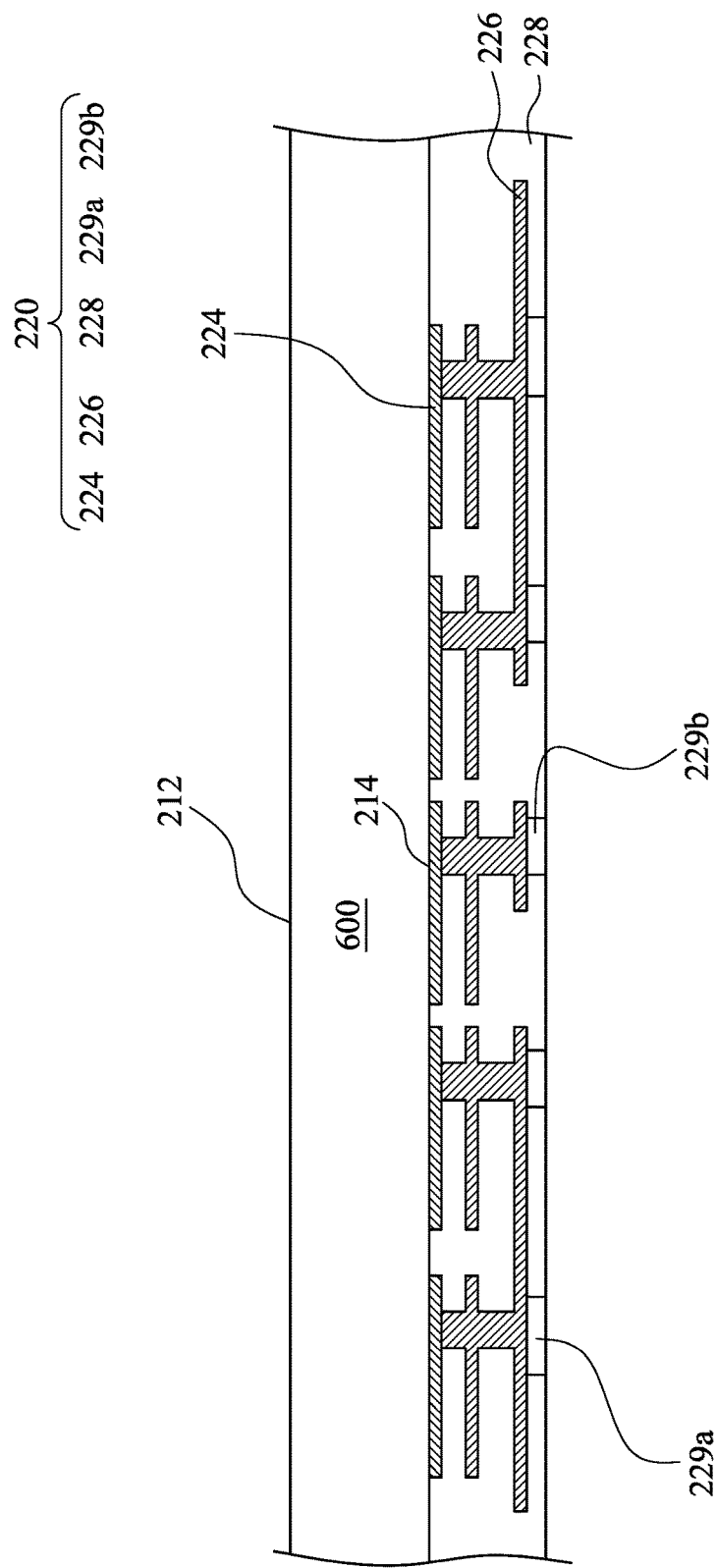

Continuing in FIG. 6E, a plurality of first conductive pads 229a are respectively formed in the first openings 620a, and a plurality of second conductive pads 229b are respectively formed in the second openings 620b. In this step, the conductive material is sputtered, evaporated, electroplated or electroless-plated to fill the first openings 620 and the second openings 620b, so as to form the first conductive pads 229a and the second conductive pads 229b. As such, the step of forming the capacitive sensing layer 220 above the second surface 214 of the substrate 600 is completed.

Figure 6F:
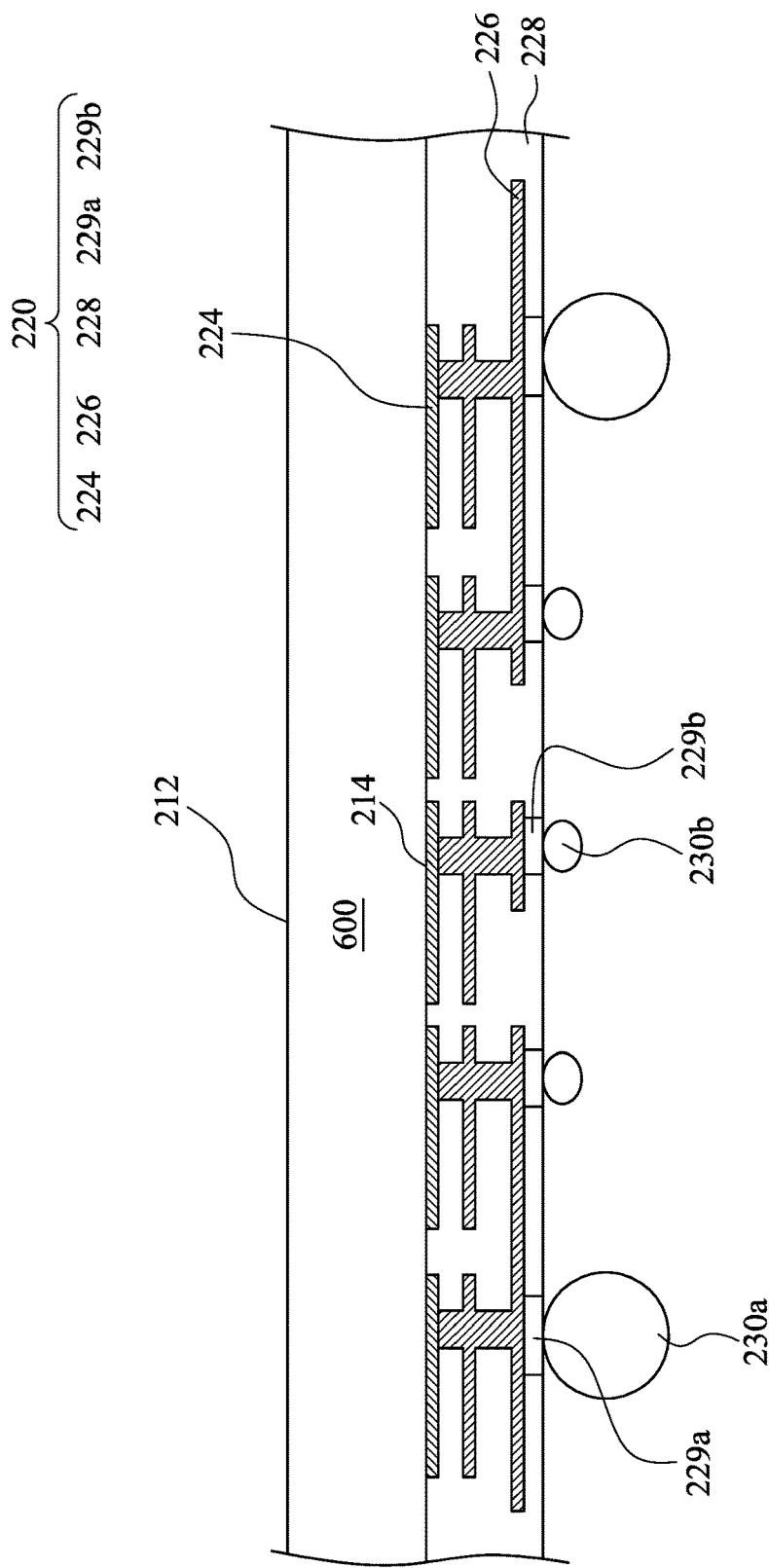

Continuing in FIG. 6F, a plurality of first external conductive connections 230a are respectively formed on the first conductive pads 229a, and a plurality of second external conductive connections 230b are respectively formed on the second conductive pads 229b. The first external conductive connections 230a are larger than second external conductive connections 230b in size. In some embodiments, the step of forming the first conductive pads 229a and the second conductive pads 229b shown in FIG. 6E is omitted, so that the first external conductive connections 230a are directly formed above the metal wires 226 exposed by the first openings 620a, and the second external conductive connections 230b are directly formed above the metal wires 226 exposed by the second openings 620b.

Figure 6G:
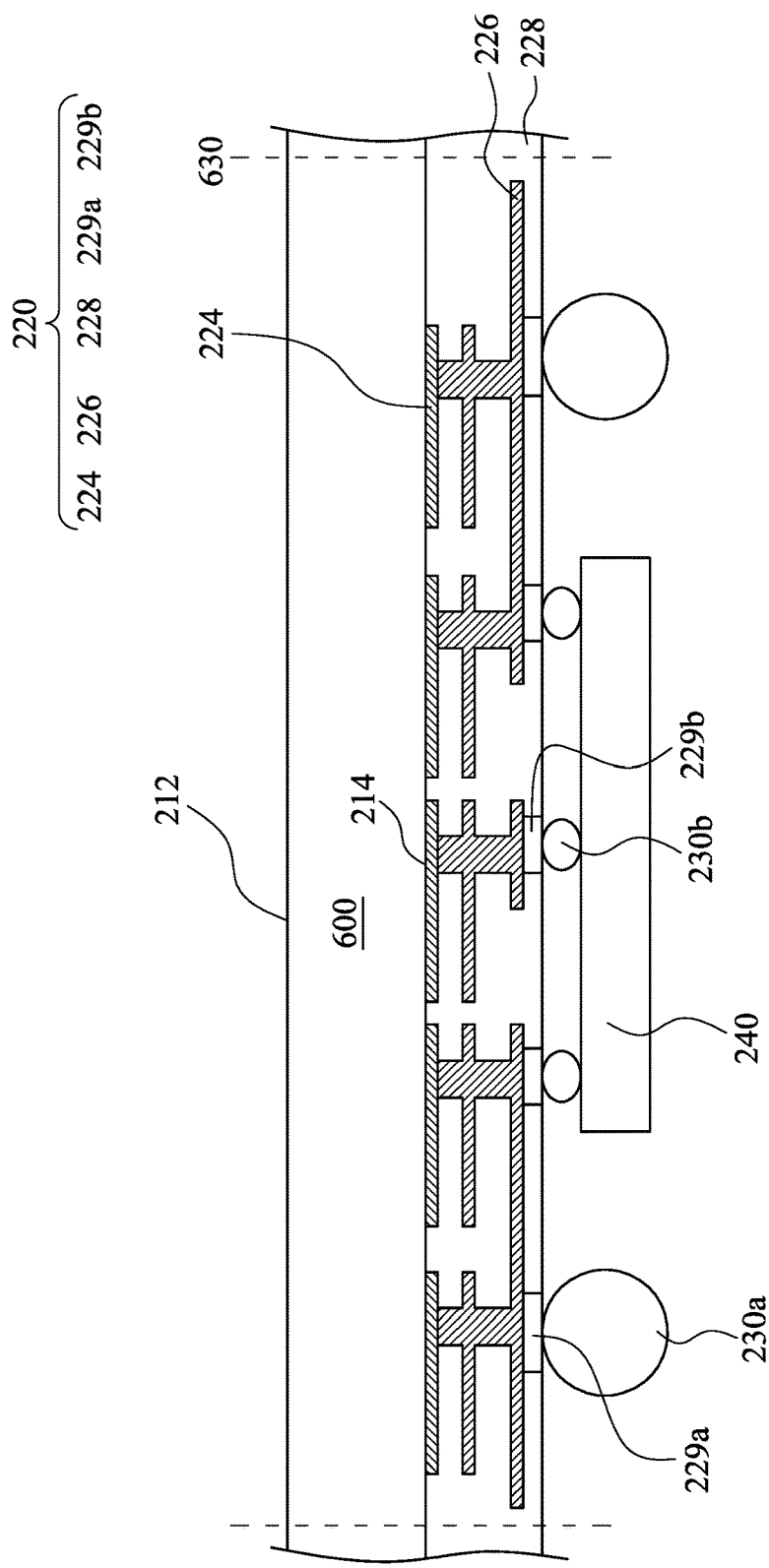

Continuing in FIG. 6G, a computing chip 240 is formed above a third surface 242 of the capacitive sensing layer 240. Specifically, the computing chip 240 is formed above the second external conductive connections 230b to be electrically connected to the capacitive sensing electrodes 224 via the second external conductive connections 230b, the second conductive pad 229b and the metal wires 226. Then, the substrate 600 and the capacitive sensing layer 220 are diced along a scribe line 630 to separate multiple computing chips 240 above the substrate 600. Thus, the chip package 200 shown in FIG. 2 is formed.

Referring now to FIGS. 7A to 7H to further understand a method of fabricating the chip package, which FIGS. 7A to 7H are cross-sectional views of the chip package in FIG. 3 at intermediate stages of fabrication, in accordance with various embodiments.

Figure 7A:
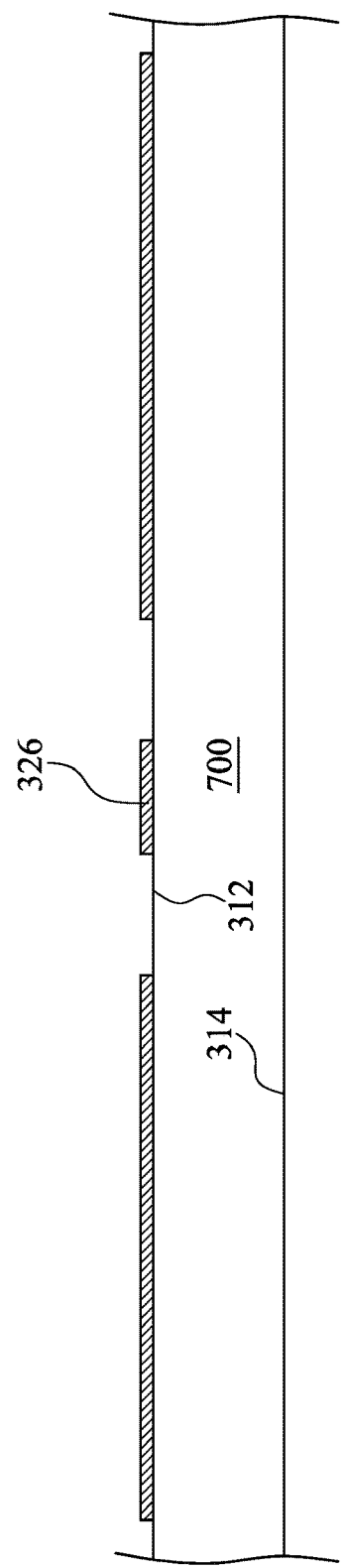
FIGS. 7A to 7H are cross-sectional views of the chip package in FIG. 3 at intermediate stages of fabrication, in accordance with various embodiments.

In FIG. 7A, a substrate 700 having a first surface 312 and a second surface 314 is received, and the first surface 312 is opposite to the second surface 314. It is worthy noting that the substrate 700 is diced to form a plurality of substrates 310 shown in FIG. 3. Then, a capacitive sensing layer 320 is formed below the first surface 312, which is different with the method described in FIG. 6A to 6G. As shown in FIG. 7A, the fabrication of the capacitive sensing layer 420 is begin with forming a plurality of metal wires 326 below the first surface 312 of the substrate 700. In this step, a conductive material is deposited below the first surface 312 by sputtering, evaporating, electroplating or electroless-plating, and the conductive material is patterned by a photolithography etching method to form these metal wires 326.

Figure 7B:
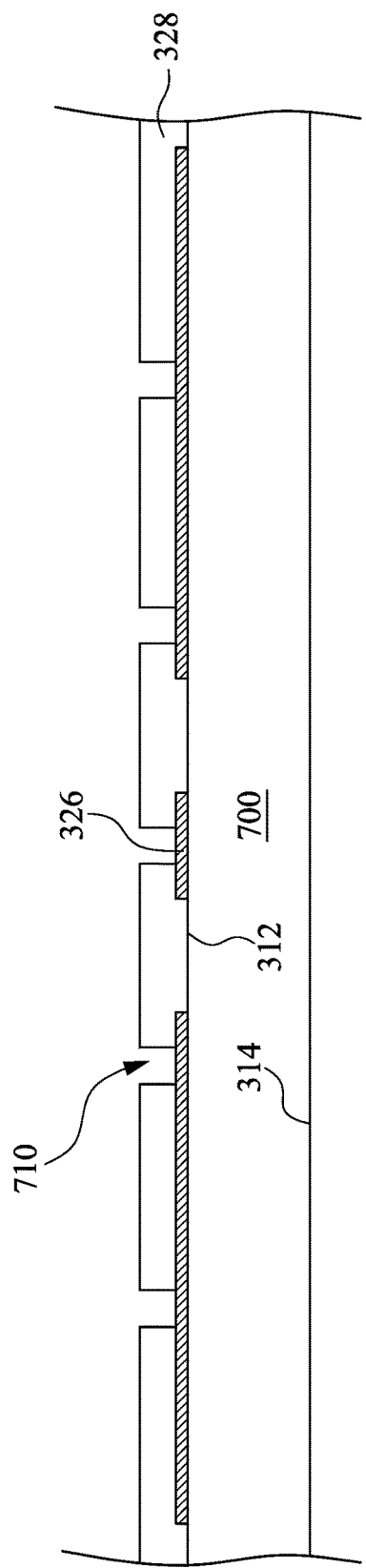

Continuing in FIG. 7B, an insulating material 328 is formed to cover the metal wires 326. The insulating material 328 may be formed by suitable deposition processes, and the insulating material 228 is further photolithography etched to form holes 710 respectively exposing the metal wires 326. These holes 710 enable the metal wires 326 to electrically connect to the capacitive sensing electrodes 324, which will be formed in the subsequent process. The photolithography etching method includes following steps. A photoresist layer is formed to cover the insulating material 328, and a mask is applied to pattern the photoresist layer. The insulating material 328 not protected by the patterned photoresist layer is etched to form holes 710 exposing the metal wires 326. Then, the patterned photoresist layer is removed. In some embodiments, the insulating material 328 is selected form a photosensitive polymer, which is directly exposed and etched to form the pattern, and thus omitting the use of the photoresist layer.

Figure 7C:
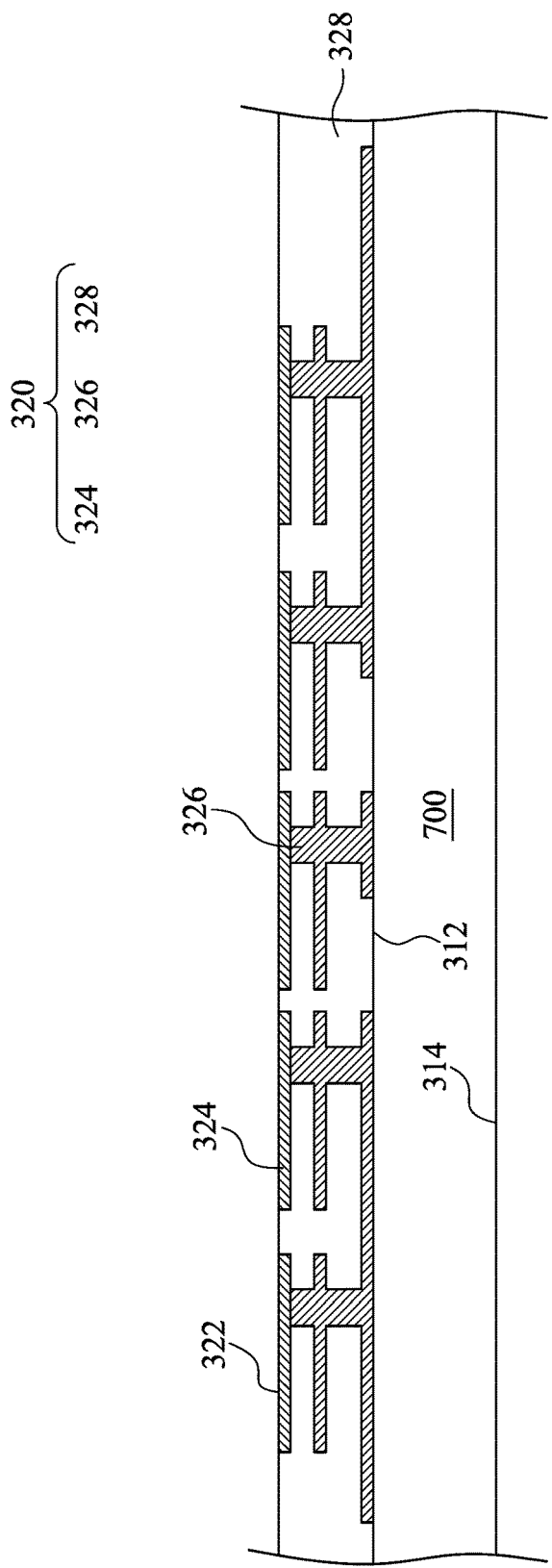

Continuing in FIG. 7C, the steps in FIG. 7A and FIG. 7B are repeated to form multi-layer metal wires 326 and insulating material 328, and these repeated steps are not described herein. Then, a plurality of capacitive sensing electrodes 324 are formed below the metal wires 326. In this step, the conductive material is deposited on the metal wires 326 and the insulating material 328 by sputtering, evaporating, electroplating or electroless-plating, and the conductive material is patterned by a photolithography etching method to form these capacitive sensing electrodes 324. The photolithography etching method includes following steps. A photoresist layer is formed to cover the conductive material, and a mask is applied to pattern the photoresist layer. The conductive material not protected by the patterned photoresist layer is etched to form the capacitive sensing electrodes 324. Then, the patterned photoresist layer is removed. As such, the step of forming the capacitive sensing layer 320 below the first surface 312 of the substrate 700 is completed.

In some embodiments, after forming the capacitive sensing layer 320, a high-k material is deposited below the capacitive sensing layer 320 to form a high-k material layer.

Figure 7D:
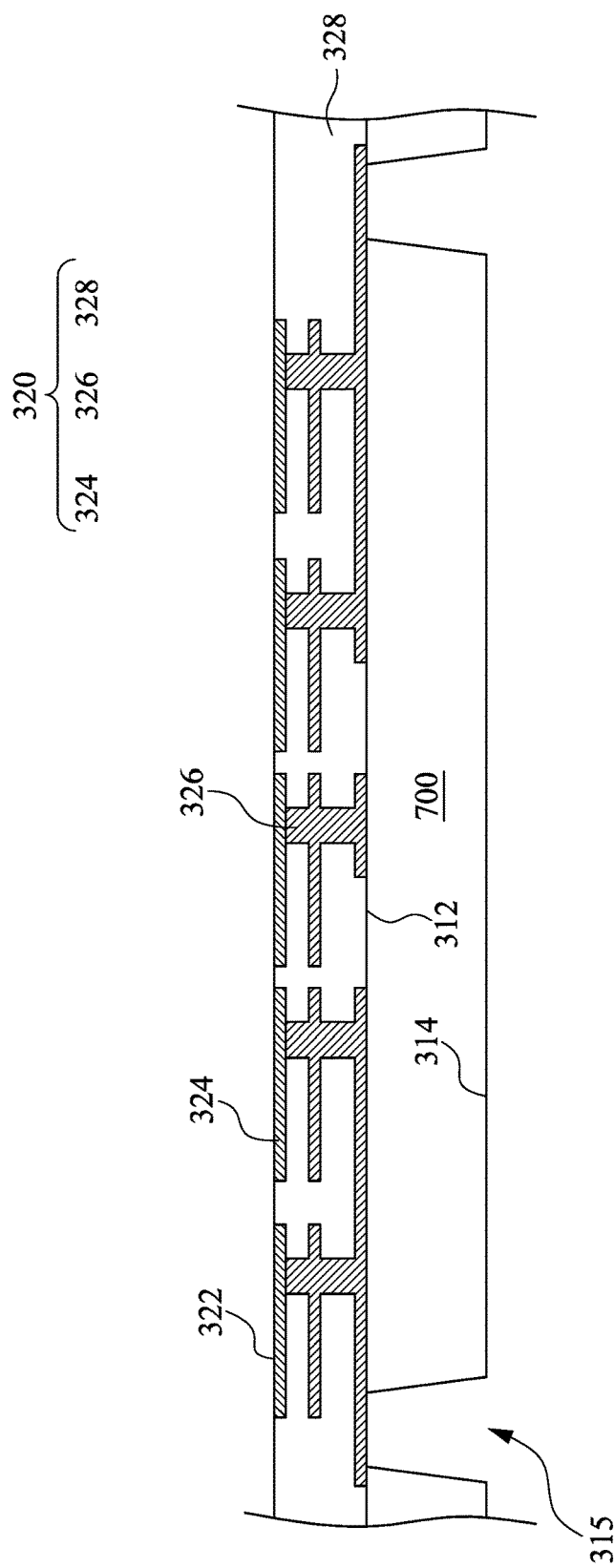

Continuing in FIG. 7D, a through hole 315 is formed extending from the second surface 314 to the first surface 312 of the substrate 700, so as to expose the metal wires 326. The through hole 315 is formed by photolithography etching, but not limited thereto.

Figure 7E:
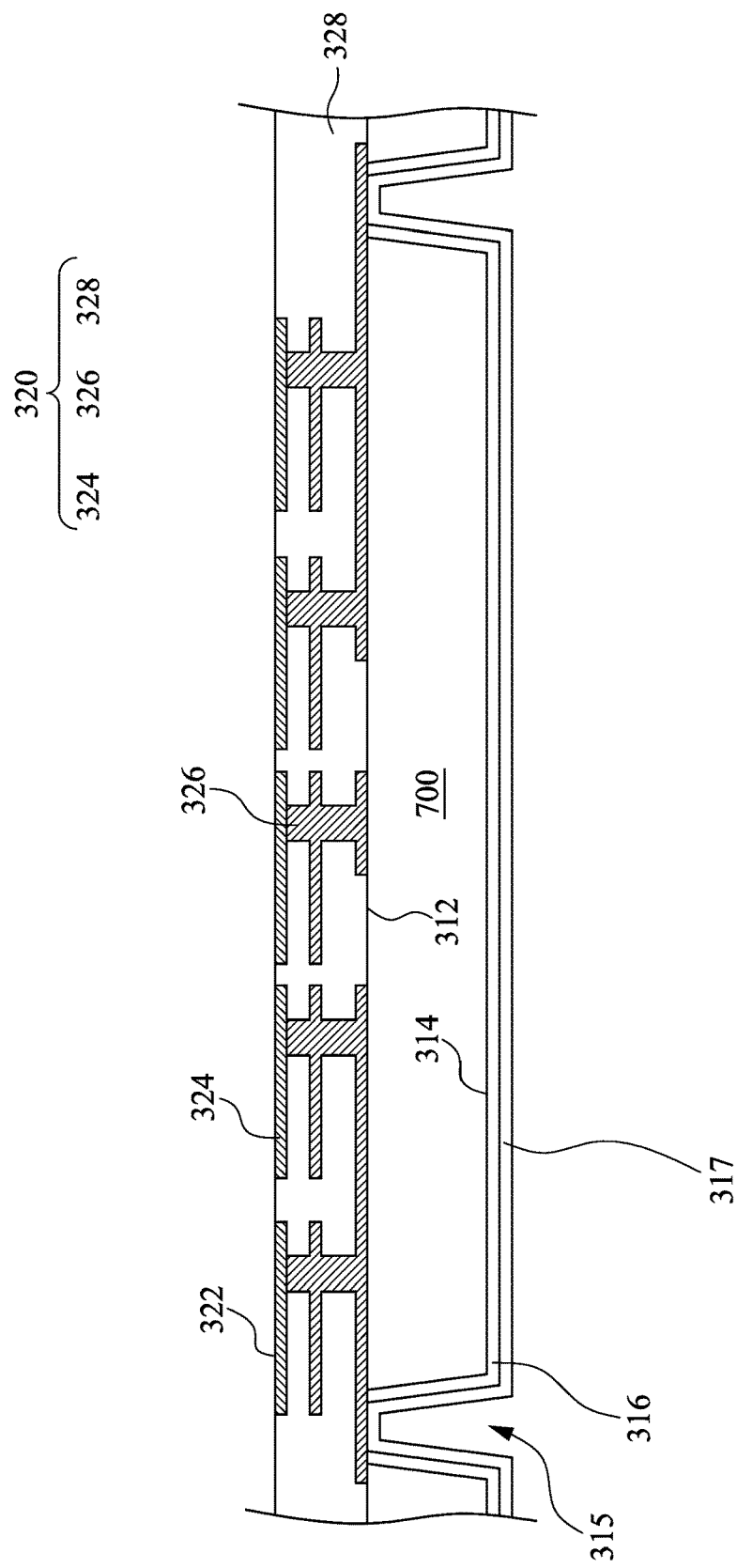

Continuing in FIG. 7E, the following steps are performed after forming the through hole 315. An isolation layer 316 is formed above the second surface 314 and in the through hole 315, and a portion of the isolation layer 316 is removed by photolithography etching, so that the metal wires 326 is exposed from the through hole 315. Then, a redistribution layer 317 is formed above the isolation layer 316, and a portion of the redistribution layer 317 is extended into the through hole 315 to contact the metal wires 326. In some embod, the conductive material is deposited on the isolation layer 316 and the metal wires 326 exposed from the through hole 315 by sputtering, evaporating, electroplating or electroless-plating, so as to form the redistribution layer 317.

Figure 7F:
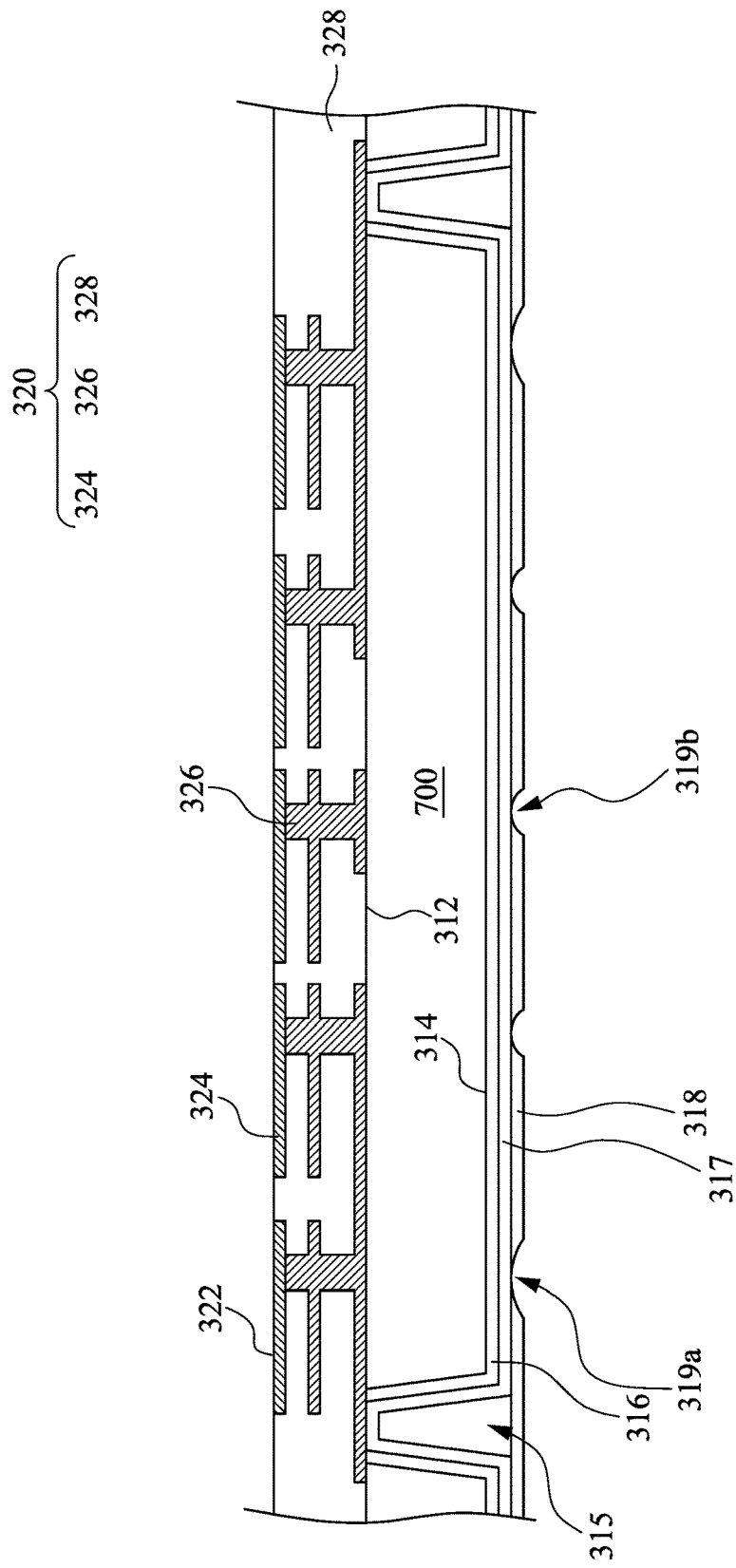

Continuing in FIG. 7F, a passivation layer 318 is formed above the redistribution layer 317, and a portion of the passivation layer 318 is removed to form a plurality of first openings 319a and second openings 319b exposing the redistribution layer 317. In this step, an epoxy material is brush-coated on the redistribution layer 317 to form the passivation layer 318. Then, the passivation layer 318 is patterned to form the first openings 319a and the second openings 319a, and a portion of the redistribution layer 317 is exposed from the first openings 319a and the second openings 319a of the passivation layer 318.

Figure 7G:
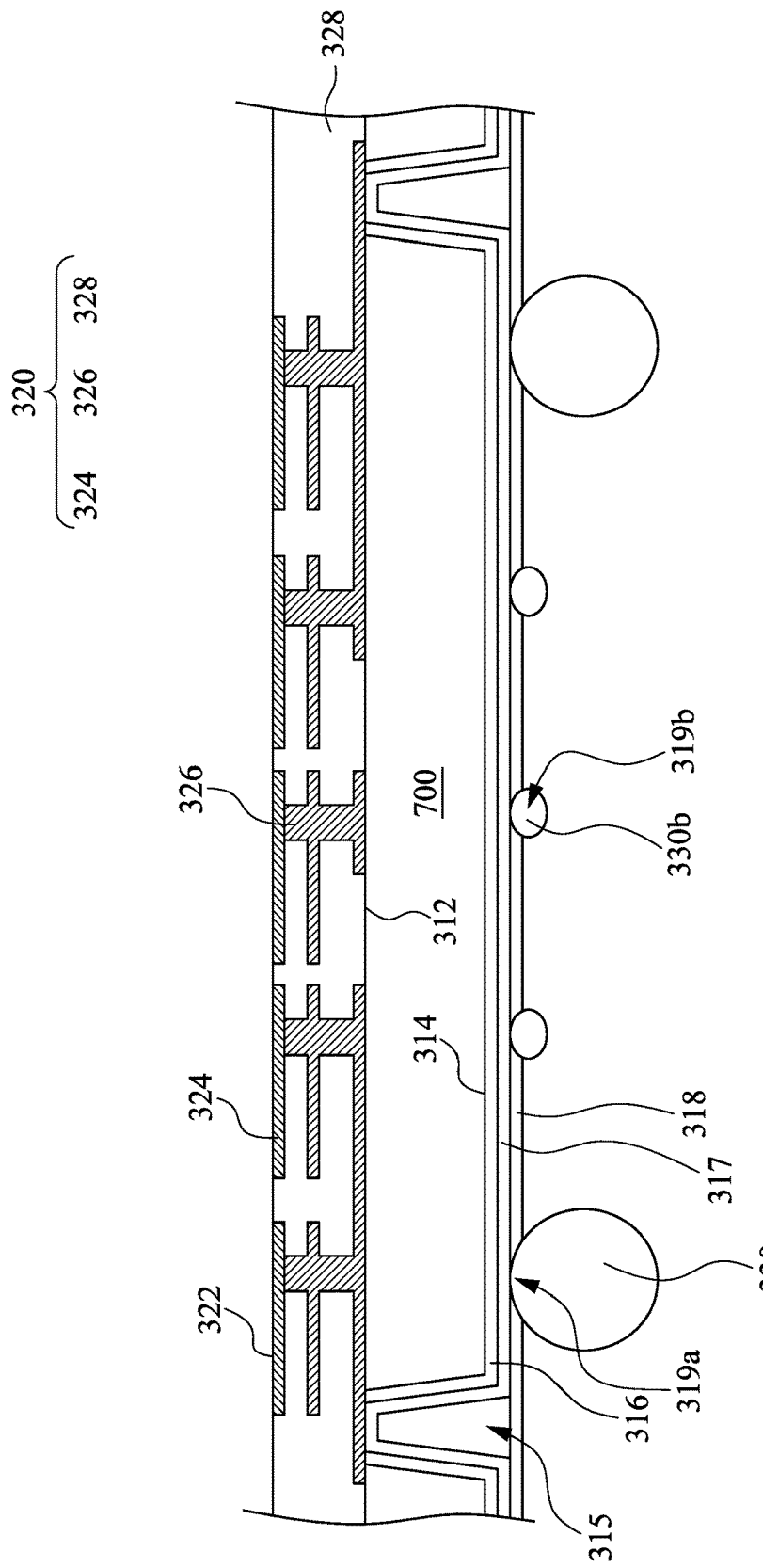

Continuing in FIG. 7G, a plurality of first external conductive connections 330a are respectively formed in the first openings 319a, and a plurality of second external conductive connections 330b are respectively formed in the second openings 319b, which the first external conductive connections 330a are larger than second external conductive connections 330b in size.

Figure 7H:
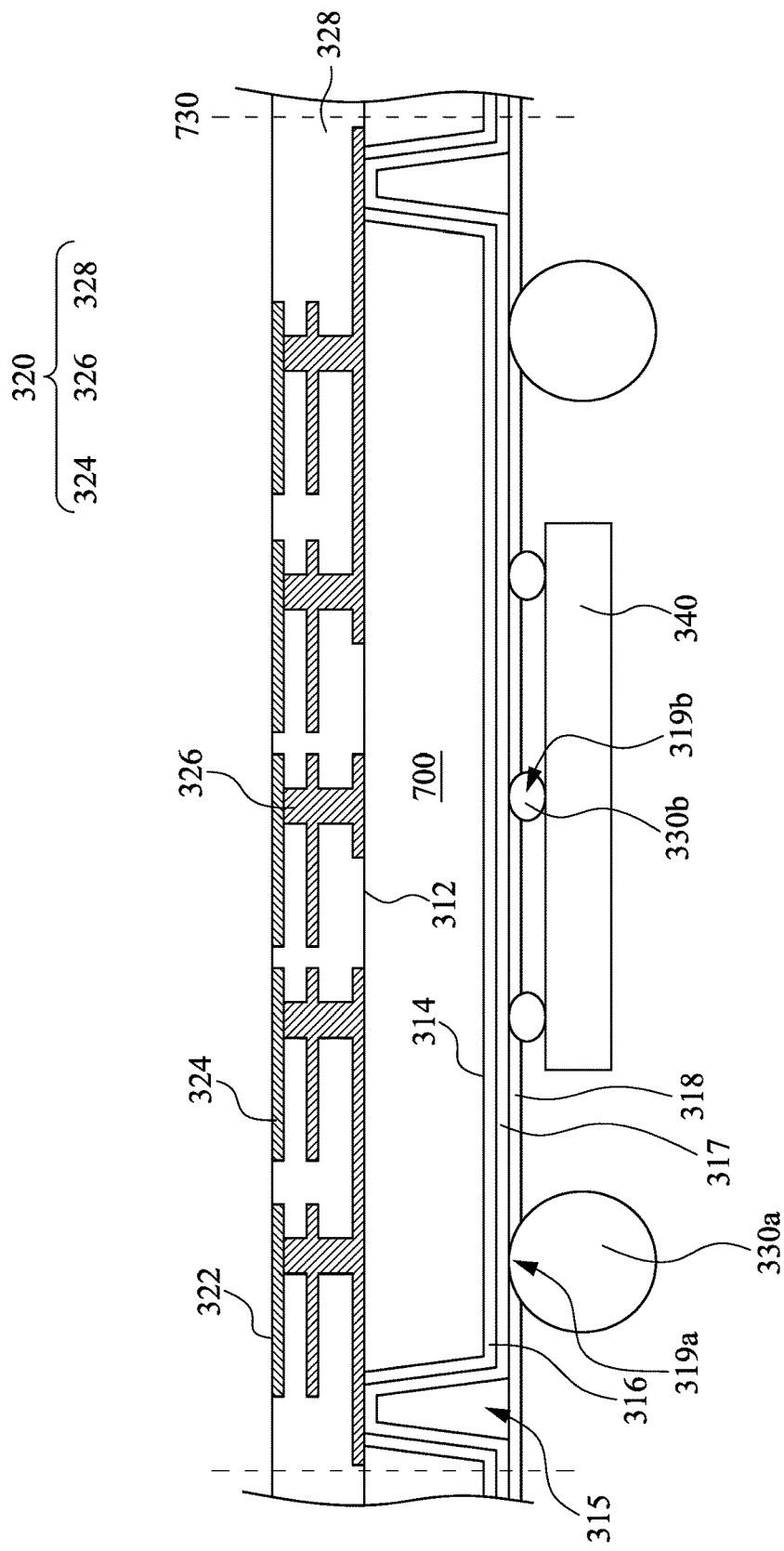

Continuing in FIG. 7H, a computing chip 340 is formed above the capacitive sensing layer 320. Specifically, the computing chip 340 is formed above second external conductive connections 330b to be electrically connected to the capacitive sensing electrodes 324 via the second external conductive connections 330b, the redistribution layer 317 and the metal wires 326. Then, the substrate 700 and the capacitive sensing layer 320 are diced along a scribe line 730 to separate multiple computing chips 340 above the substrate 700. Thus, the chip package 300 shown in FIG. 3 is formed.

Referring now to FIGS. 8A to 8H to further understand a method of fabricating the chip package, which FIGS. 8A to 8H are cross-sectional views of the chip package in FIG. 4 at intermediate stages of fabrication, in accordance with various embodiments.

Figure 8A:
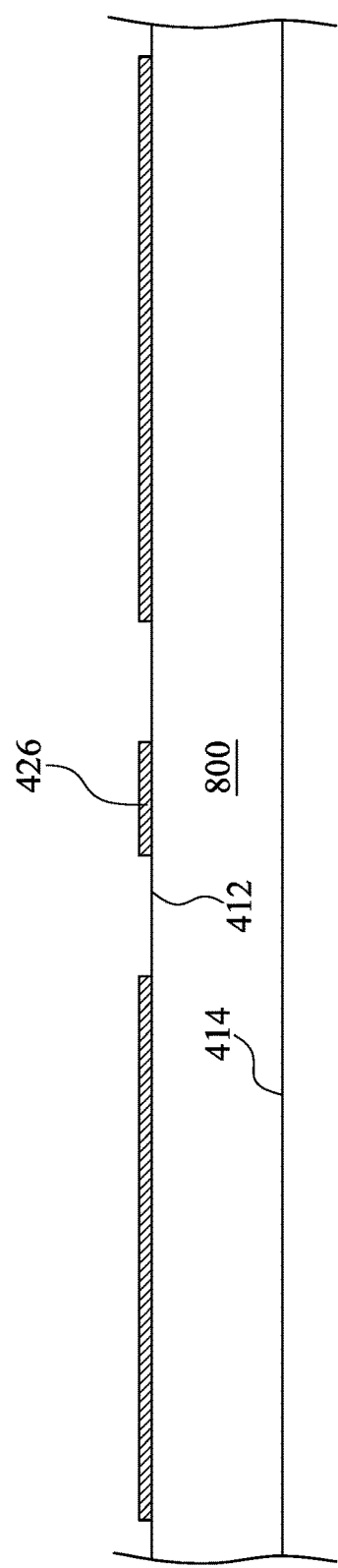
FIGS. 8A to 8H are cross-sectional views of the chip package in FIG. 4 at intermediate stages of fabrication, in accordance with various embodiments.

In FIG. 8A, a substrate 800 having a first surface 412 and a second surface 414 is received, and the first surface 412 is opposite to the second surface 414. It is worthy noting that the substrate 800 is diced to form a plurality of substrates 410 shown in FIG. 4. Then, a capacitive sensing layer 420 is formed below the first surface 412. As shown in FIG. 8A, the fabrication of the capacitive sensing layer 420 is begin with forming a plurality of metal wires 426 below the first surface 412 of the substrate 800. In this step, a conductive material is deposited below the first surface 412 by sputtering, evaporating, electroplating or electroless-plating, and the conductive material is patterned by a photolithography etching method to form these metal wires 426.

Figure 8B:
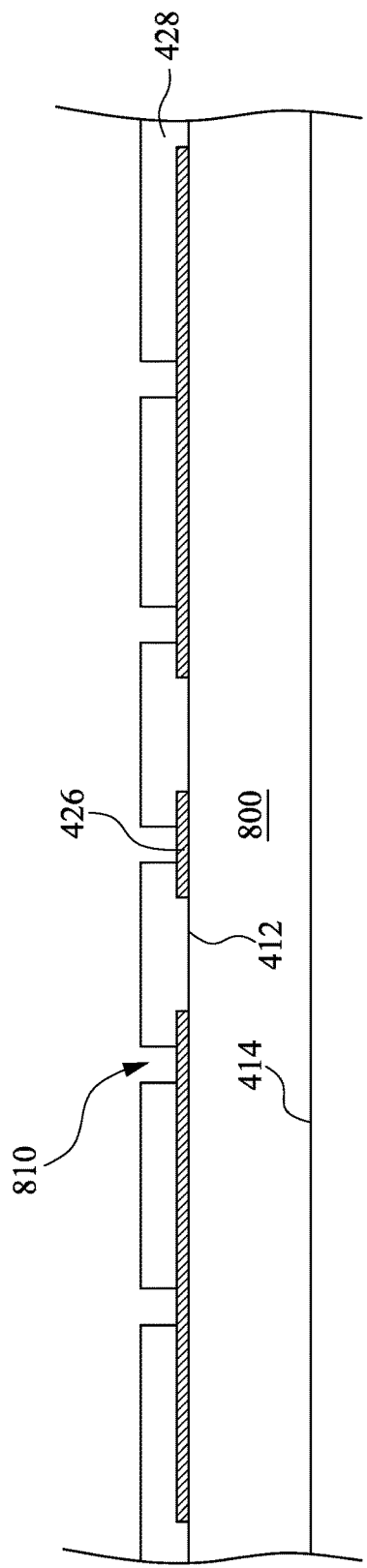

Continuing in FIG. 8B, an insulating material 428 is formed to cover the metal wires 426. The insulating material 428 may be formed by suitable deposition processes, and the insulating material 428 is further photolithography etched to form holes 810 respectively exposing the metal wires 426. These holes 810 enable the metal wires 426 to electrically connect to the capacitive sensing electrodes 424, which will be formed in the subsequent process. The photolithography etching method includes following steps. A photoresist layer is formed to cover the insulating material 428, and a mask is applied to pattern the photoresist layer. Then, the insulating material 328 not protected by the patterned photoresist layer is etched to form holes 810 exposing the metal wires 426, and the patterned photoresist layer is removed. In some embodiments, the insulating material 428 is selected form a photosensitive polymer, which is directly exposed and etched to form the pattern, and thus omitting the use of the photoresist layer.

Figure 8C:
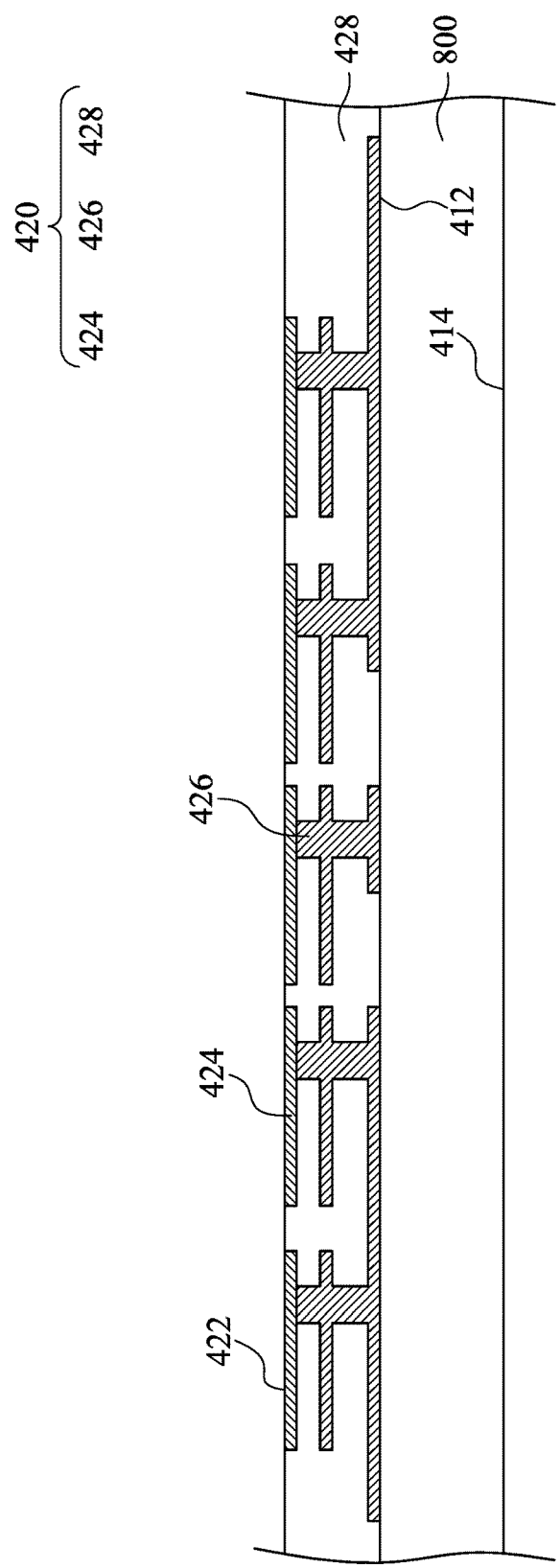

Continuing in FIG. 8C, the steps in FIG. 8A and FIG. 8B are repeated to form multi-layer metal wires 426 and insulating material 428, and these repeated steps are not described herein. Then, a plurality of capacitive sensing electrodes 424 are formed below the metal wires 426. In this step, the conductive material is deposited on the metal wires 426 and the insulating material 428 by sputtering, evaporating, electroplating or electroless-plating, and the conductive material is patterned by a photolithography etching method to form these capacitive sensing electrodes 424. The photolithography etching method includes following steps. A photoresist layer is formed to cover the conductive material, and a mask is applied to pattern the photoresist layer. Then, the conductive material not protected by the patterned photoresist layer is etched to form the capacitive sensing electrodes 424, and the patterned photoresist layer is removed. As such, the step of forming the capacitive sensing layer 420 below the first surface 412 of the substrate 800 is completed.

In some embodiments, after forming the capacitive sensing layer 420, a high-k material is deposited below the capacitive sensing layer 420 to form a high-k material layer.

Figure 8D:
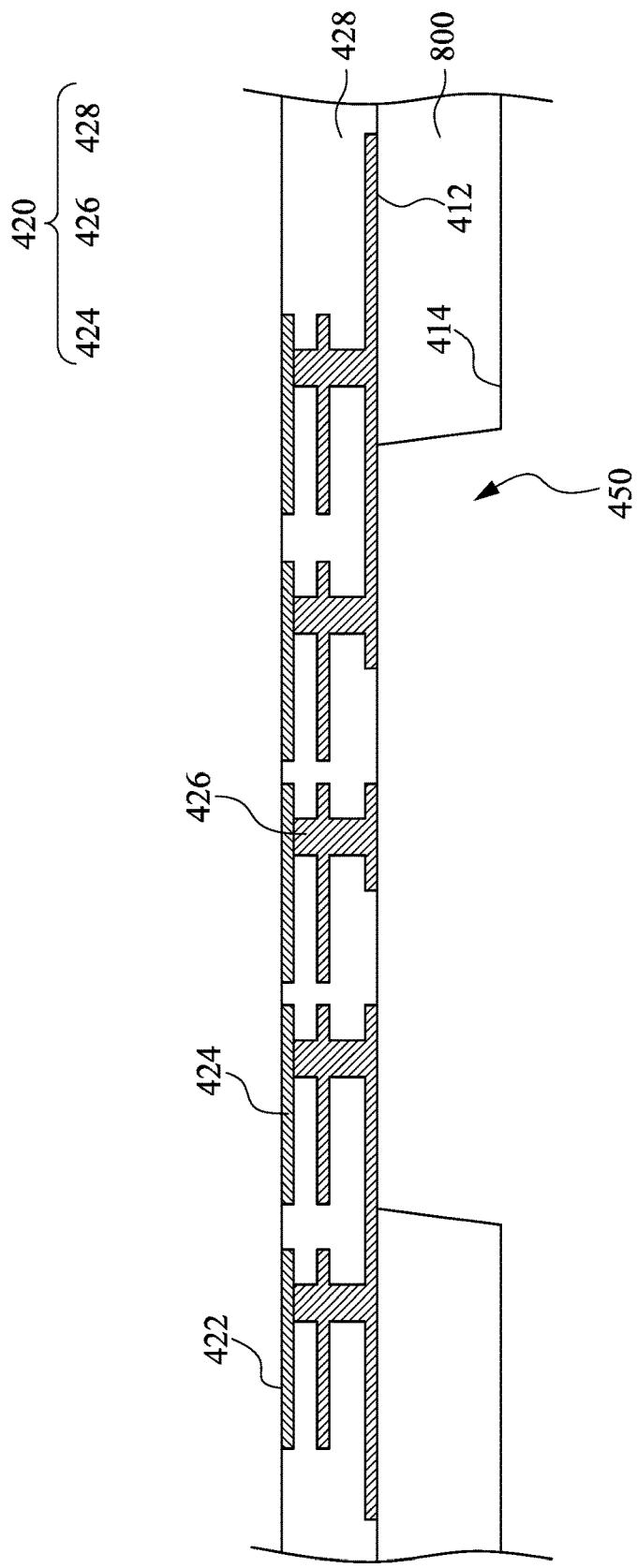

Continuing in FIG. 8D, a recess 450 is formed extending from the second surface 414 to the first surface 412 of the substrate 800, so as to expose the metal wires 426. The recess 450 is formed by photolithography etching, but not limited thereto.

Figure 8E:
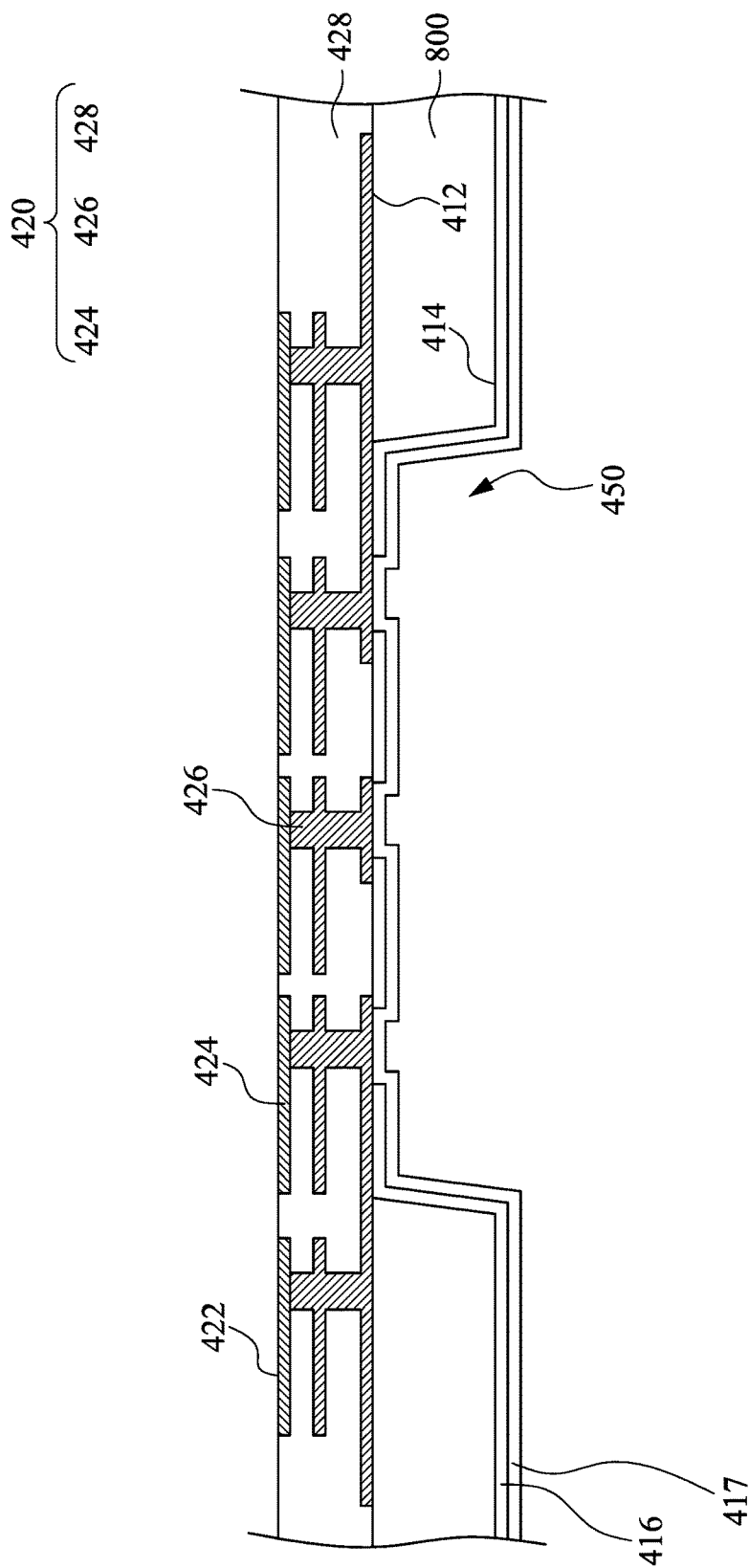

Continuing in FIG. 8E, the following steps are performed after forming the recess 450. An isolation layer 416 is formed above the second surface 414 and in the recess 450, and a portion of the isolation layer 416 is removed by photolithography etching, so that the metal wires 426 is exposed from the recess 450. Then, a redistribution layer 417 is formed above the isolation layer 416, and a portion of the redistribution layer 417 is extended into the recess 450 to contact the metal wires 426. In some embodiments, the conductive material is deposited on the isolation layer 416 and the metal wires 426 exposed from the recess 450 by sputtering, evaporating, electroplating or electroless-plating, so as to form the redistribution layer 417.

Figure 8F:
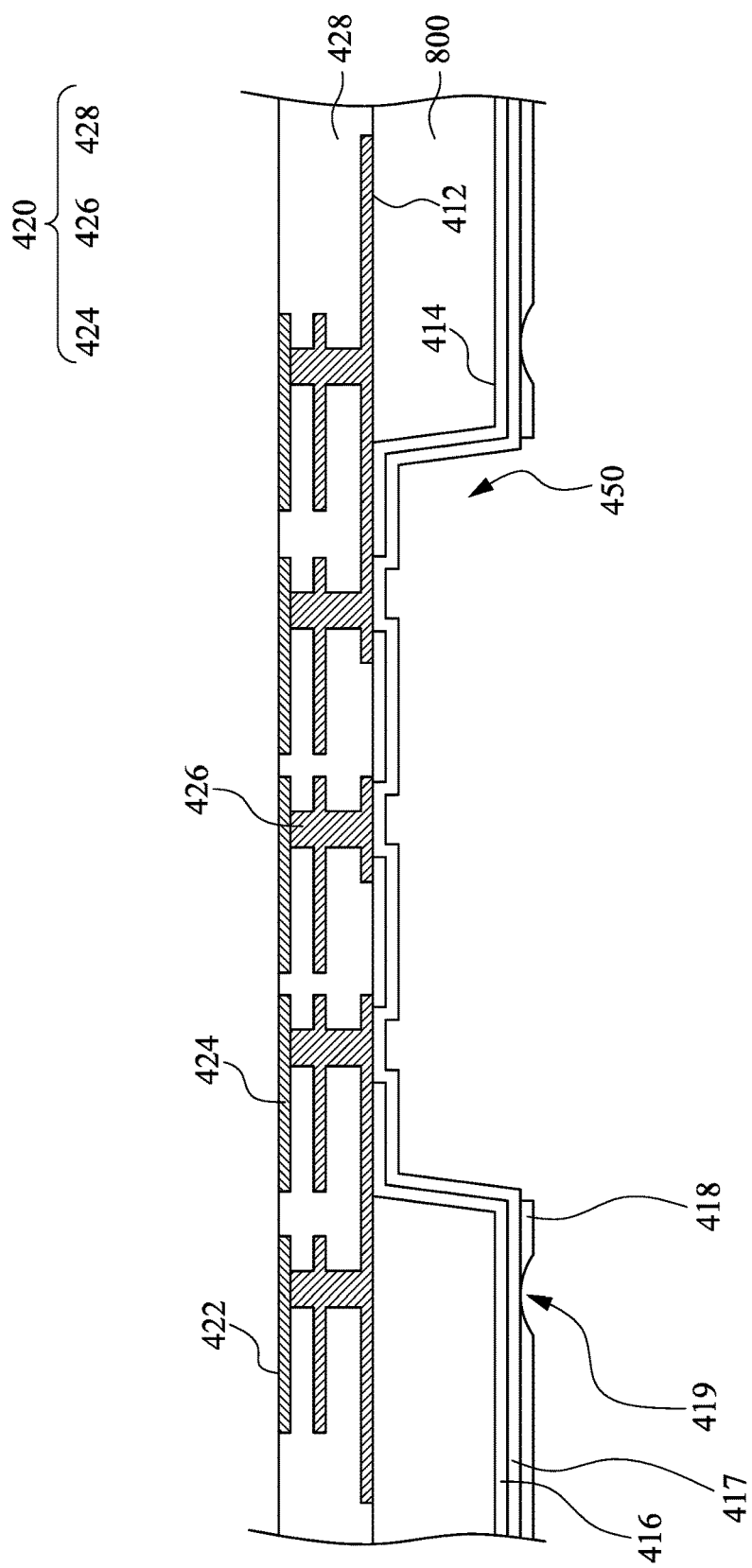

Continuing in FIG. 8F, a passivation layer 418 is formed to cover the redistribution layer 417 above the second surface 414, and a portion of the passivation layer 418 is removed to form a plurality of first openings 419 exposing the redistribution layer 417 above the second surface 414. In this step, an epoxy material is brush-coated on the redistribution layer 417 to form the passivation layer 418. Then, the passivation layer 418 is patterned to form the first openings 419, and a portion of the redistribution layer 417 is exposed from the first openings 419 of the passivation layer 418.

Figure 8G:
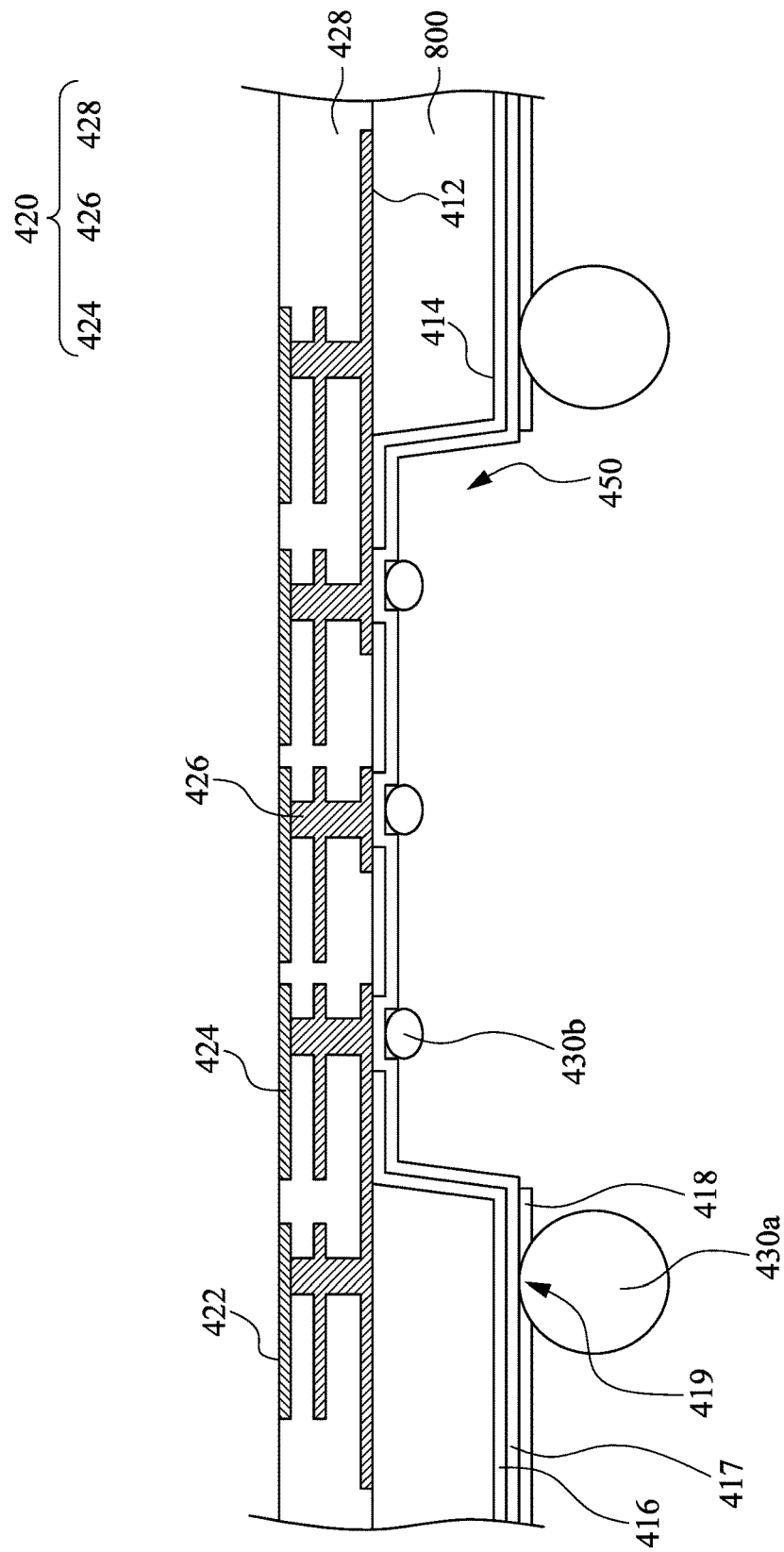

Continuing in FIG. 8G, a plurality of first external conductive connections 430a are respectively formed in the first openings 419, and a plurality of second external conductive connections 430b are formed in the recess 450 to contact the redistribution layer 417 in the recess 450, which the first external conductive connections 430a are larger than second external conductive connections 430b in size.

Figure 8H:
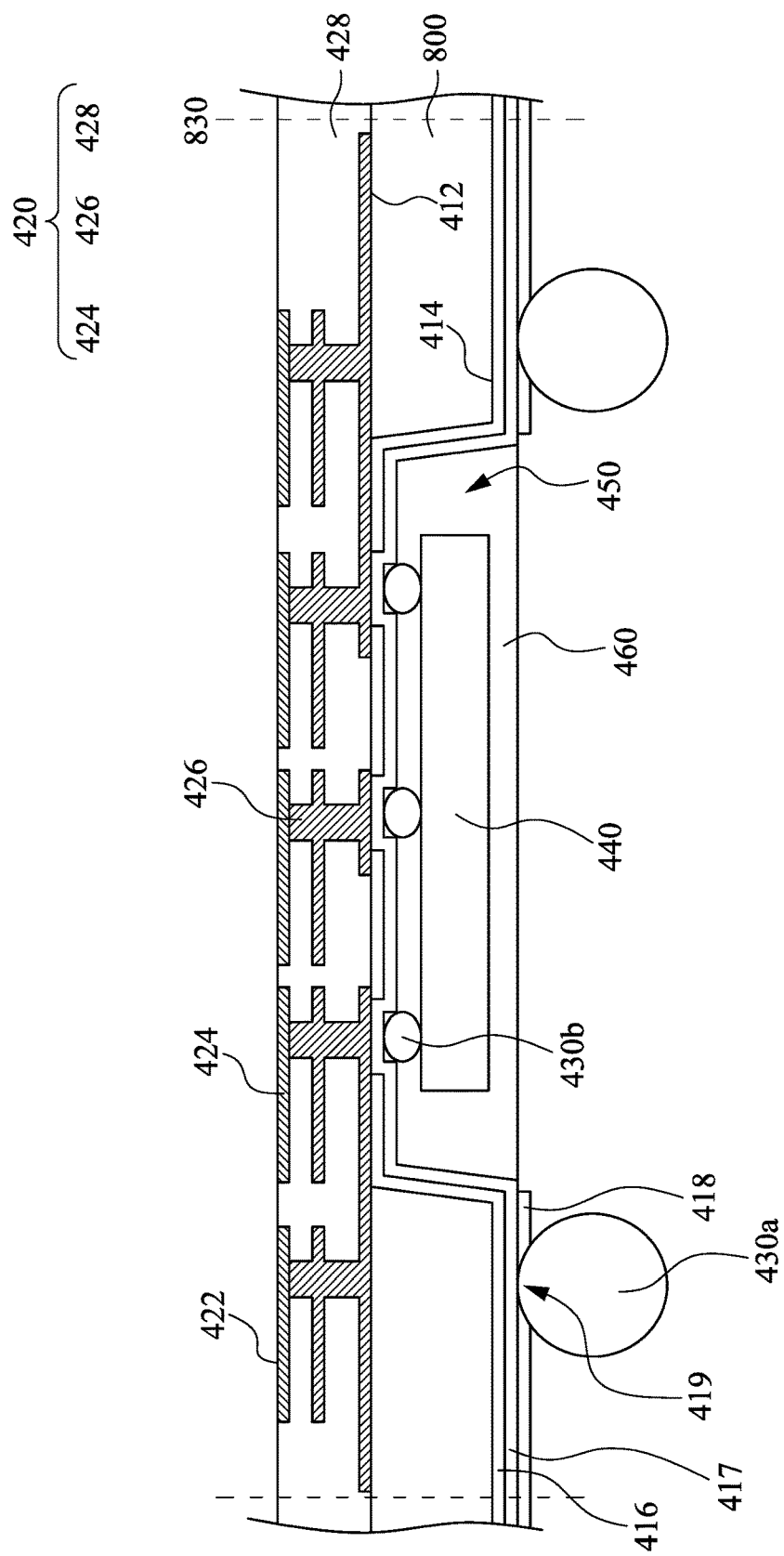

Continuing in FIG. 8H, a computing chip 440 is formed above the capacitive sensing layer 420. Specifically, the computing chip 440 is formed above the second external conductive connections 430b to be electrically connected to the capacitive sensing electrodes 424 via the second external conductive connections 430b, the redistribution layer 417 and the metal wires 426. After that, an epoxy material is filled in the recess 450 by molding, so as to form a protecting layer 460 covering the computing chip 4450 and the second external conductive connections 430b. Then, the substrate 800 and the capacitive sensing layer 420 are diced along a scribe line 830 to separate multiple computing chips 440 above the substrate 800. Thus, the chip package 400 shown in FIG. 4 is formed.

The embodiments of the present disclosure discussed above have advantages over existing methods and structures, and the advantages are summarized below. The computing chip of the chip package is not disposed in the capacitive sensing layer, and therefore complicated processes are not necessary for wiring to export the signals generated by the computing chip. As such, process time and machine costs could be significantly saved. On the other hand, there is no additional process applied on the capacitive sensing layer, which has excellent flatness to improve detecting accuracy of the chip package.

Although the present invention has been described in considerable detail with reference to certain embodiments thereof, other embodiments are possible. Therefore, the spirit and scope of the appended claims should not be limited to the description of the embodiments contained herein. Reference will now be made in detail to the embodiments of the invention, examples of which are illustrated in the accompanying drawings. Wherever possible, the same reference numbers are used in the drawings and the description to refer to the same or like parts.

What is claimed is:

1. A chip package, comprising:
   a substrate having a first surface and a second surface opposite to the first surface;
   a capacitive sensing layer disposed below the first surface and having a third surface opposite to the first surface, the capacitive sensing layer comprising:
   a plurality of capacitive sensing electrodes disposed on the third surface, and
   a plurality of metal wires disposed on the capacitive sensing electrodes
   a computing chip disposed above the capacitive sensing layer and electrically connected to the capacitive sensing electrodes; and
   a recess extending from the second surface to the first surface to expose the metal wires, and the computing chip is in the recess.

2. The chip package of claim 1, further comprising a through hole extending from the second surface to the first surface to expose the metal wires.

3. The chip package of claim 2, further comprising:
   an isolation layer disposed above the second surface and extending into the through hole to cover sidewalls of the through hole;
   a redistribution layer disposed above the isolation layer and extending into the through hole to contact the metal wires;
   a passivation layer disposed above the redistribution layer, and the passivation layer having a plurality of first openings and second openings exposing the redistribution layer;
   a plurality of first external conductive connections respectively in the first openings to contact the redistribution layer; and
   a plurality of second external conductive connections respectively in the second openings to contact the redistribution layer.

4. The chip package of claim 3, wherein the computing chip is disposed above the second surface and the second external conductive connections.

5. The chip package of claim 4, wherein the first external conductive connections are electrically connected to the computing chip via the redistribution layer and the second external conductive connections.

6. The chip package of claim 1, further comprising:
an isolation layer disposed above the second surface and extending into the recess to cover sidewalls of the recess;
a redistribution layer disposed above the isolation layer and extending into the recess to contact the metal wires;
a passivation layer disposed above the redistribution layer, and the passivation layer having a plurality of first openings exposing the redistribution layer above the second surface;
a plurality of first external conductive connections respectively in the first openings to contact the redistribution layer, and the first external conductive connections being electrically connected to the computing chip; and
a plurality of second external conductive connections in the recess to contact the redistribution layer.

7. The chip package of claim 6, wherein the computing chip is disposed above the second external conductive connections.

8. The chip package of claim 7, wherein the first external conductive connections are electrically connected to the computing chip via the redistribution layer and the second external conductive connections.

9. The chip package of claim 7, further comprising a protecting layer in the recess to cover the computing chip and the second external conductive connections.

10. The chip package of claim 1, wherein the substrate comprises silicon.

11. A method of fabricating a chip package, comprising:
receiving a substrate having a first surface and a second surface opposite to the first surface;
forming a capacitive sensing layer below the first surface, and the capacitive sensing layer having a third surface opposite to the first surface, the capacitive sensing layer being formed by:
forming a plurality of metal wires below the first surface; and
forming a plurality of capacitive sensing electrodes below the metal wires;
forming a computing chip above the capacitive sensing layer to electrically connect the capacitive sensing electrodes and the computing chip; and
forming a recess extending from the second surface to the first surface to expose the metal wires, and the computing chip being formed in the recess.

12. The method of fabricating the chip package of claim 11, further comprising:
forming a through hole extending from the second surface to the first surface to expose the metal wires.

13. The method of fabricating the chip package of claim 12, further comprising:
forming an isolation layer above the second surface and in the through hole;
removing a portion of the isolation layer to expose the metal wires;
forming a redistribution layer above the isolation layer and extending into the through hole to contact the metal wires;
forming a passivation layer above the redistribution layer;
removing a portion of the passivation layer to form a plurality of first openings and second openings exposing the redistribution layer;
forming a plurality of first external conductive connections respectively in the first openings; and
forming a plurality of second external conductive connections respectively in the second openings, and the computing chip being formed above the second external conductive connections.

14. The method of fabricating the chip package of claim 13, wherein the first external conductive connections and the second external conductive connections are simultaneously formed in the same process step.

15. The method of fabricating the chip package of claim 13, further comprising dicing the substrate and the capacitive sensing layer along a scribe line to form the chip package.

16. The method of fabricating the chip package of claim 11, further comprising forming a recess extending from the second surface to the first surface to expose the metal wires, and the computing chip being formed in the recess.

17. The method of fabricating the chip package of claim 16, further comprising:
forming an isolation layer above the second surface and in the recess;
removing a portion of the isolation layer to expose the metal wires;
forming a redistribution layer above the isolation layer and extending into the recess to contact the metal wires;
forming a passivation layer to cover the redistribution layer above the second surface;
removing a portion of the passivation layer to form a plurality of first openings exposing the redistribution layer above the second surface;
forming a plurality of first external conductive connections respectively in the first openings; and
forming a plurality of second external conductive connections in the recess, and the computing chip being formed above the second external conductive connections.

18. The method of fabricating the chip package of claim 17, wherein the first external conductive connections and the second external conductive connections are simultaneously formed in the same process step.

19. The method of fabricating the chip package of claim 17, further comprising forming a protecting layer in the recess to cover the computing chip and the second external conductive connections.

20. The method of fabricating the chip package of claim 19, further comprising dicing the substrate and the capacitive sensing layer along a scribe line to form the chip package.

* * * * *